United States Patent
Tsai et al.

(10) Patent No.: US 10,418,513 B2
(45) Date of Patent: *Sep. 17, 2019

(54) COMPOUND SEMICONDUCTOR DEVICE AND METHOD OF FABRICATING THE SAME

(71) Applicant: EPISTAR CORPORATION, Hsinchu (TW)

(72) Inventors: Chia Chen Tsai, Hsinchu (TW); Chen Ou, Hsinchu (TW); Chi Ling Lee, Hsinchu (TW); Chi Shiang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,573

(22) Filed: Sep. 27, 2018

(65) Prior Publication Data

US 2019/0027643 A1 Jan. 24, 2019

Related U.S. Application Data

(63) Continuation of application No. 15/872,202, filed on Jan. 16, 2018, now Pat. No. 10,134,947, which is a
(Continued)

(51) Int. Cl.
| | |
|---|---|
| *H01L 33/02* | (2010.01) |
| *H01L 33/00* | (2010.01) |
| *H01L 33/62* | (2010.01) |
| *H01L 33/22* | (2010.01) |
| *H01L 33/20* | (2010.01) |

(Continued)

(52) U.S. Cl.
CPC .......... *H01L 33/0095* (2013.01); *H01L 21/78* (2013.01); *H01L 21/784* (2013.01); *H01L 33/02* (2013.01); *H01L 33/025* (2013.01); *H01L 33/20* (2013.01); *H01L 33/22* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 7,838,331 B2 | 11/2010 | Komura et al. | |
| 9,287,176 B2 | 3/2016 | Fukaya | |

(Continued)

*Primary Examiner* — Minh Loan Tran
(74) *Attorney, Agent, or Firm* — Ditthavong & Steiner, P.C.

(57) ABSTRACT

A compound semiconductor device includes a substrate, including a top surface, a bottom surface, a side surface connecting the top surface and the bottom surface; and a semiconductor stack formed on the top surface, wherein the side surface includes a first deteriorated surface, a second deteriorated surface, a first crack surface between the first and second deteriorated surfaces, a second crack surface between the first deteriorated surface and the top surface, and a third crack surface between the second deteriorated surface and the bottom surface, wherein the first crack surface is inclined to the first deteriorated surface or the second deteriorated surface; and wherein the second crack surface or the third crack surface is substantially perpendicular to the top surface or the bottom surface.

18 Claims, 18 Drawing Sheets

Related U.S. Application Data continuation of application No. 15/475,817, filed on Mar. 31, 2017, now Pat. No. 9,893,231, which is a continuation-in-part of application No. 15/074,193, filed on Mar. 18, 2016, now abandoned.

(60) Provisional application No. 62/135,447, filed on Mar. 19, 2015.

(51) Int. Cl.
*H01L 21/784* (2006.01)
*H01L 21/78* (2006.01)

(56) References Cited

U.S. PATENT DOCUMENTS

| | | |
|---|---|---|
| 10,134,947 B2 * | 11/2018 | Tsai .................. H01L 21/784 |
| 2007/0111390 A1 | 5/2007 | Komura et al. |
| 2007/0298529 A1 | 12/2007 | Maeda et al. |
| 2009/0160035 A1 | 6/2009 | Suzuki et al. |
| 2012/0261678 A1 | 10/2012 | Hiraiwa et al. |
| 2015/0054824 A1 | 3/2015 | Fukaya |
| 2016/0158880 A1 | 6/2016 | Koitzsch et al. |
| 2016/0218067 A1 | 7/2016 | Masuko et al. |

* cited by examiner

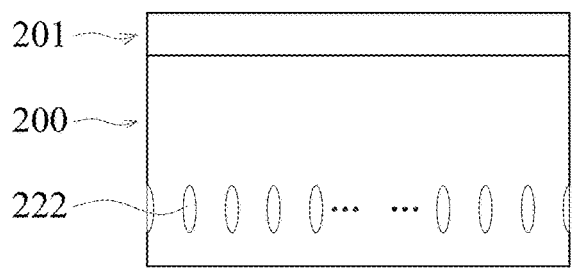
FIG. 1H
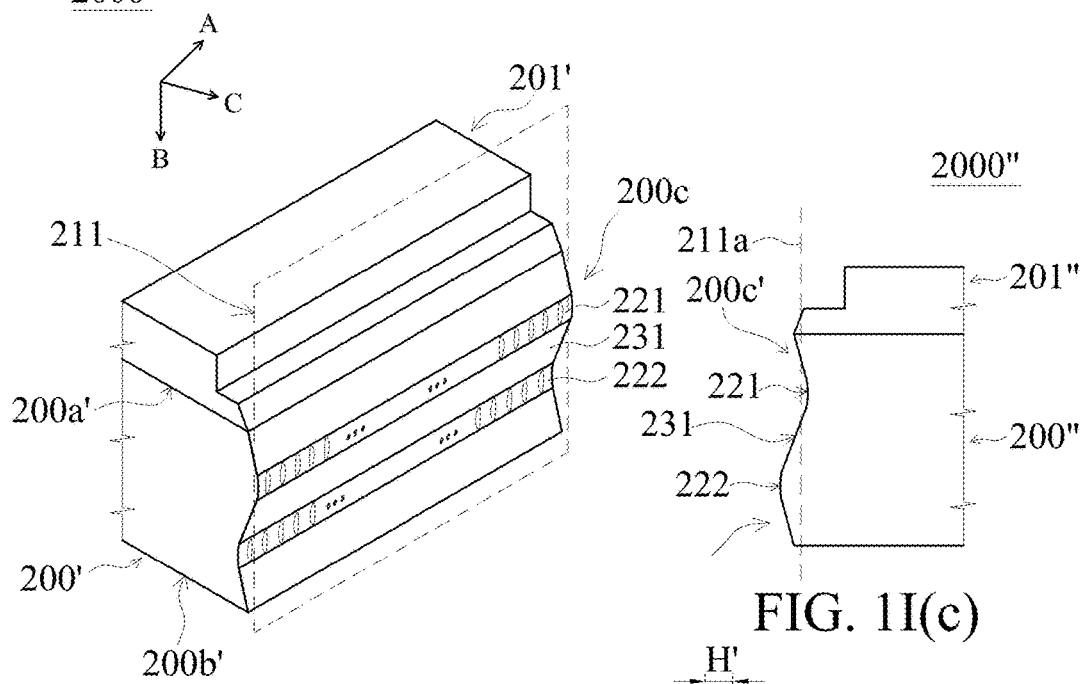
FIG. 1I(a)
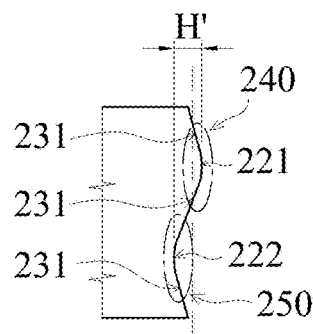
FIG. 1I(b)
FIG. 1I(c)

COMPOUND SEMICONDUCTOR DEVICE AND METHOD OF FABRICATING THE SAME

CROSS-REFERENCE TO RELATED APPLICATIONS

This application is a continuation application of U.S. patent application Ser. No. 15/872,202 entitled "LIGHT EMITTING DEVICE AND METHOD OF FABRICATING THE SAME", filed on Jan. 16, 2018, which is a continuation of U.S. patent application Ser. No. 15/475,817, now U.S. Pat. No. 9,893,231, filed on Mar. 31, 2017, which is a continuation in-part application of U.S. patent application Ser. No. 15/074,193, filed on Mar. 18, 2016, which claimed the benefit of U.S. Provisional Patent Application Ser. No. 62/135,447 filed on Mar. 19, 2015, the contents of which are incorporated by reference in their entireties.

BACKGROUND

Technical Field

The present disclosure relates to a compound semiconductor device, more particularly, to a light emitting device with improved brightness.

Description of the Related Art

The light radiation theory of light emitting diode (LED) is when a suitable voltage is applied to the LED, electrons are able to recombine with holes within the LED, releasing energy in the form of photons. Because the light radiation theory of LEDs is different from the incandescent light which is through the heating of filament, the LED is also called a "cold" light source. Moreover, the LED is also more sustainable, longevous, light and handy, and less power-consumption, therefore it is considered a new generation product in the lighting markets. The brightness enhancement and process yield improvement of the LED are two important topics in the field.

SUMMARY OF THE INVENTION

An exemplary embodiment of the invention discloses a compound semiconductor device, including a substrate, including a top surface, a bottom surface, a side surface connecting the top surface and the bottom surface; and a semiconductor stack formed on the top surface, wherein the side surface includes a first deteriorated surface, a second deteriorated surface, a first crack surface between the first and second deteriorated surfaces, a second crack surface between the first deteriorated surface and the top surface, and a third crack surface between the second deteriorated surface and the bottom surface, wherein the first crack surface is inclined to the first deteriorated surface or the second deteriorated surface; and wherein the second crack surface or the third crack surface is substantially perpendicular to the top surface or the bottom surface.

Another exemplary embodiment of the invention discloses a compound semiconductor device, including a substrate, including a top surface, a bottom surface, a side surface connecting the top surface and the bottom surface; and a semiconductor stack formed on the top surface, wherein the side surface includes a first deteriorated surface, a second deteriorated surface, a first crack surface between the first and second deteriorated surfaces, a second crack surface between the first deteriorated surface and the top surface, and a third crack surface between the second deteriorated surface and the bottom surface, wherein one of a convex region and a concave region is formed by the first deteriorated surface, the first crack surface and the second crack surface, and another one of the convex region and the concave region is formed by the second deteriorated surface, the first crack surface and the third crack surface; and wherein the second crack surface or the third crack surface is substantially perpendicular to the top surface or the bottom surface.

Another exemplary embodiment of the invention discloses a compound semiconductor device including: a substrate, including a top surface, a bottom surface, a side surface connecting the top surface and the bottom surface; and a semiconductor stack formed on the top surface, wherein the side surface includes a first deteriorated surface, a second deteriorated surface, a first crack surface between the first and second deteriorated surfaces, a second crack surface between the first deteriorated surface and the top surface, and a third crack surface between the second deteriorated surface and the bottom surface, wherein the first and second deteriorated surfaces are rougher than at least one of the first crack surface, the second crack surface and the third crack surface; and wherein the second crack surface is about perpendicular to the top surface, and the third crack surface is about perpendicular to the bottom surface.

BRIEF DESCRIPTION OF THE DRAWINGS

FIGS. 1G-1H are cross-sectional views of a wafer through the transverse direction C in accordance with one embodiment of the present disclosure.

FIGS. 1I(a)-1I(c) are a perspective view of a first light emitting device and cross-sectional views of the first light emitting device and a second light emitting device' through a direction A in accordance with one embodiment of the present disclosure.

DETAILED DESCRIPTION OF THE PREFERRED EMBODIMENTS

Figure 1A:
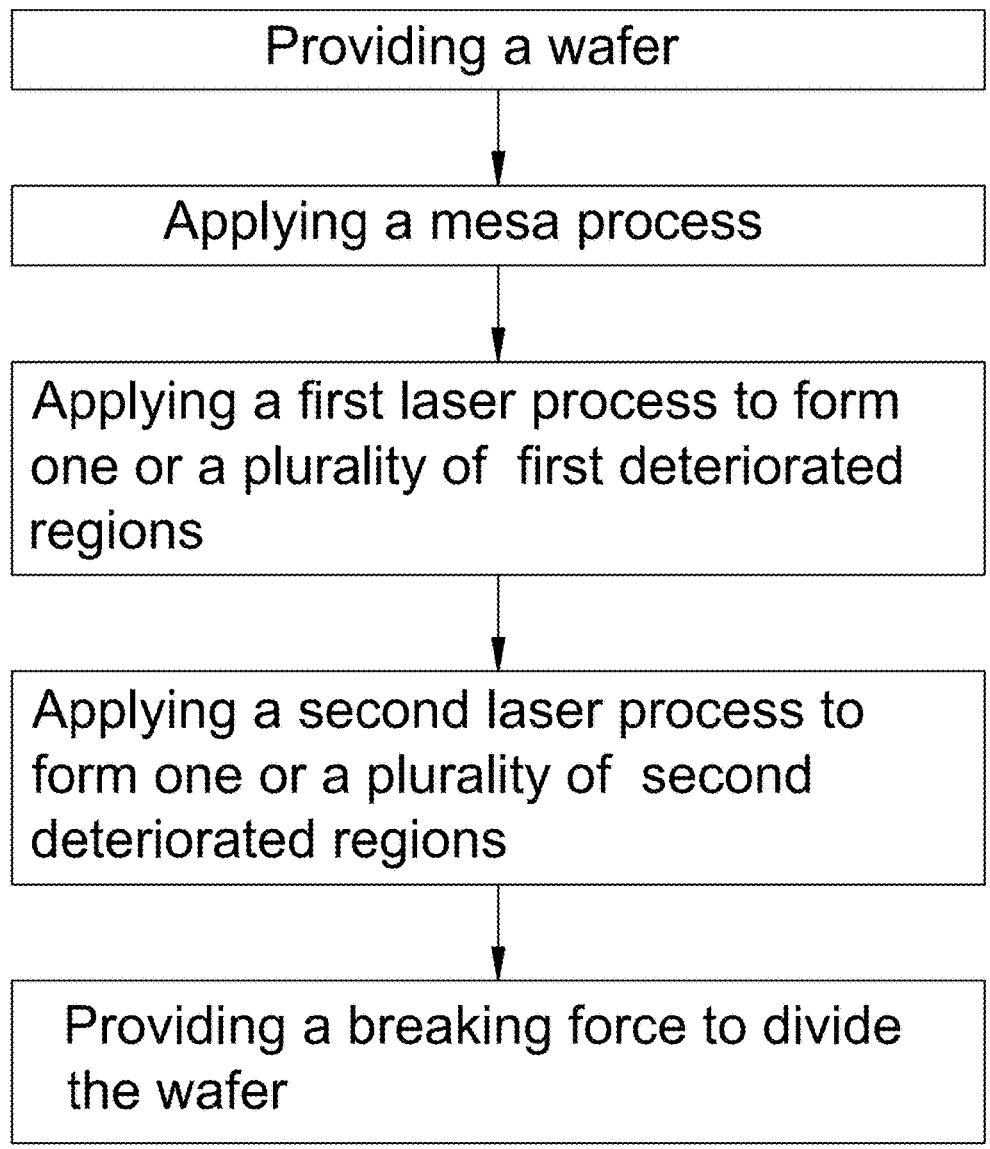
FIG. 1A is a process flow of a method for fabricating light emitting devices in accordance with one embodiment of the present disclosure.

To better and concisely explain the disclosure, the same name or the same reference number given or appeared in different paragraphs or figures along the specification should has the same or equivalent meanings while it is once defined anywhere of the disclosure.

In the embodiments of the present disclosure, a substrate can include sapphire with a patterned structure, and a top surface of the substrate is a C-plane (0001) surface. The substrate can have a thickness of 100-300 μm. The substrate can also include a material selected from Si, SiC, GaN, and GaAs. A semiconductor stack includes a first semiconductor layer, a second semiconductor layer and an active layer formed between the first semiconductor layer and the second semiconductor layer. The first semiconductor layer can be n-type, the second semiconductor can be p-type, and the active layer can emit light by electron-hole recombination. The active layer can be a single heterostructure (SH), double heterostructure (DH), double-side double heterostructure (DDH), or multi-quantum well structure (MQW). The semiconductor stack includes a material selected from elements including Si, Ga, Al, In, N, P, and As. A first electrode and a second electrode can be formed on the semiconductor stack or the substrate, and connect to a submount by die bonding or wire bonding. The submount can further connect to a power source. In the embodiments of the present disclosure, a light emitting device includes but not limited to a light emitting diode and a laser diode. Optoelectronics including a photodiode and a solar cell, or semiconductor devices including high electron mobility transistor (HEMT), field effect transistors (FETs), or other semiconductor integrated circuits can also be included in the embodiments of the present disclosure. A laser can be a stealth dicing laser including a picosecond or a femtosecond laser. In the embodiments of the present disclosure, an irradiation power of such a stealth dicing laser can be 0.3 KW-0.5 KW. In the embodiments of the present disclosure, a laser process includes applying a laser beam focusing in an object and is capable of doing such as marking, cutting, engraving, or drilling on the object. A deteriorated region includes a region treated by a laser process. In the embodiments of the present disclosure, the deteriorated region is a region which is weakened or disintegrated in mechanism by a laser beam treatment in the laser process. In the embodiments of the present disclosure, the deteriorated region includes a roughening surface formed by a laser beam in a laser process. In the embodiments of the present disclosure, the deteriorated region is opaque. A breaking process includes a process separating a whole object, such as a wafer, to several parts. In the embodiments of the present disclosure, the breaking process can be accomplished by mechanical sawing or cutting via a breaking force. The breaking force in the breaking process can be a mechanical sawing machine or diamond needles. The embodiments are not limited, any modification or replacement to reach the same function, result can be also included in the present disclosure.

FIGS. 1A-1I illustrate a method of manufacturing a first and second light emitting devices 2000', 2000" in accordance with a first embodiment of the present disclosure. As shown in FIG. 1A, the steps of the method includes providing a wafer, applying a mesa process, applying a first laser process to form one or a plurality of first deteriorated regions, applying a second laser process to form one or a plurality of second deteriorated regions, and providing a breaking force to divide the wafer. The details of the steps are described as follows.

Figure 1B:
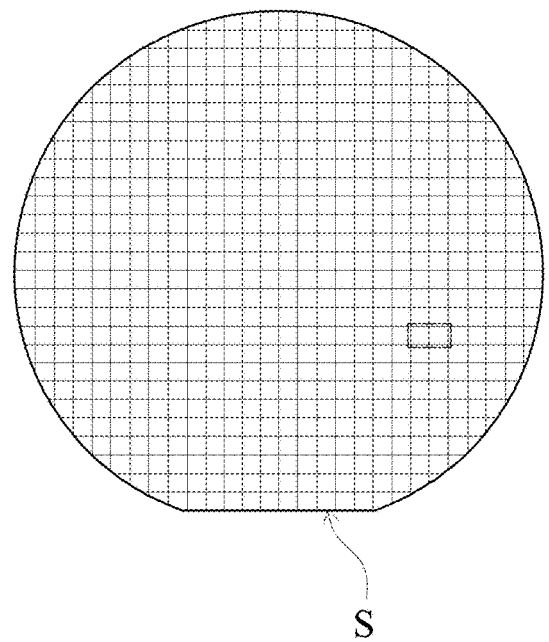
FIG. 1B is a top view of a wafer in accordance with one embodiment of the present disclosure.
Figure 1C:
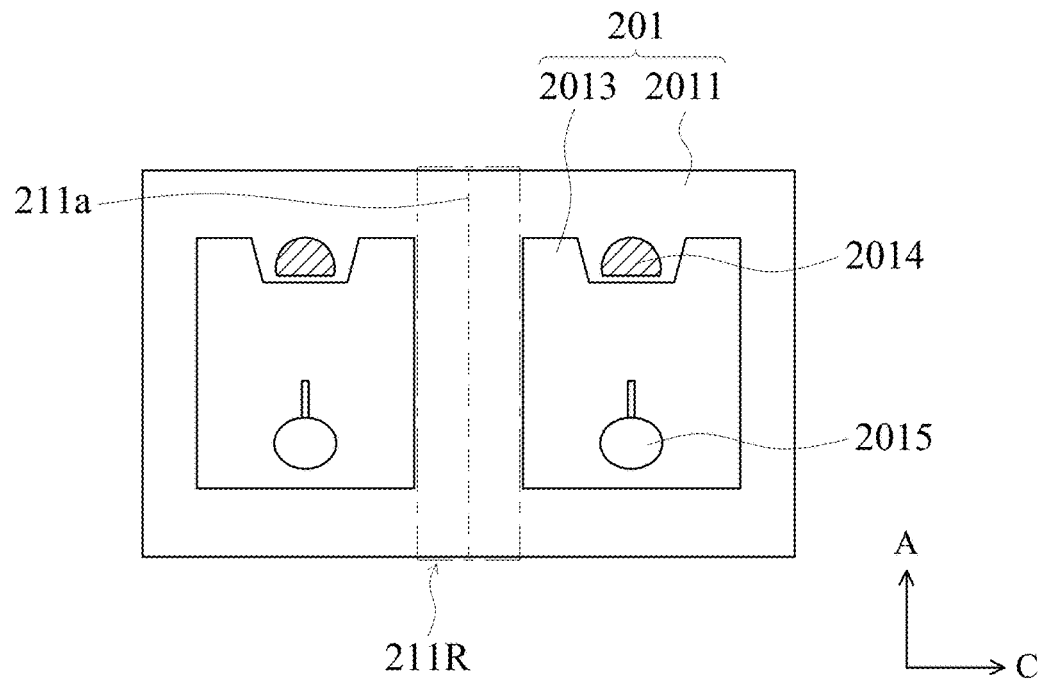
FIG. 1C is an enlarged top view of the FIG. 1B of a portion of the wafer in accordance with one embodiment of the present disclosure.
Figure 1D:
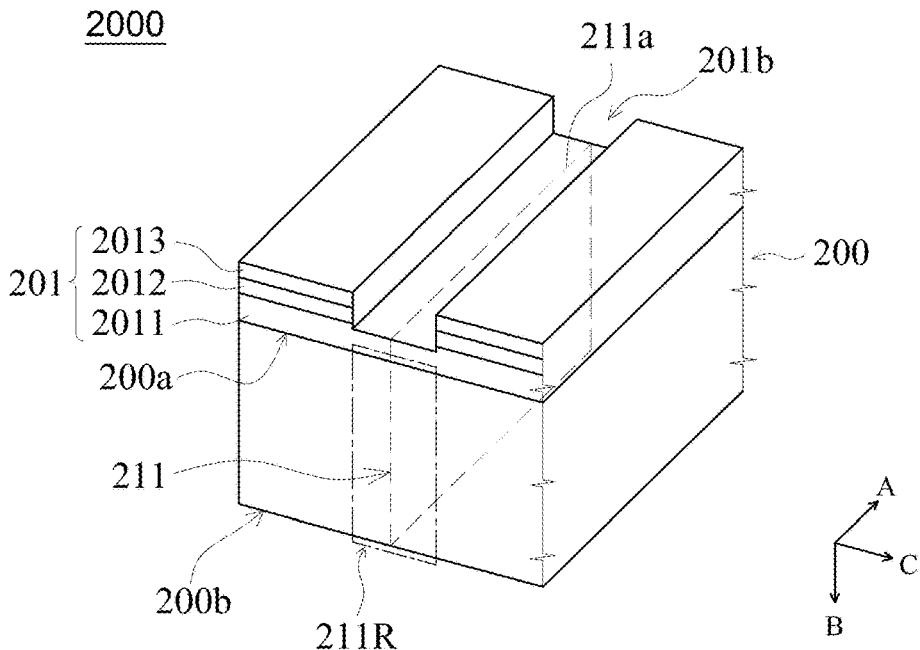
FIGS. 1D-1F are perspective views of a wafer in accordance with one embodiment of the present disclosure.

FIG. 1B is a top view of a wafer 2000, FIG. 1C is a top view of a partial enlargement of the wafer 2000, and FIG. 1D is a perspective view of the partial enlargement of the wafer 2000. As shown in FIGS. 1B-1D, in the step of providing a wafer, a wafer substrate 200, including a top surface 200a and a bottom surface 200b, is provided to epitaxially form a semiconductor stack 201. The semiconductor stack 201 and the wafer substrate 200 compose the wafer 2000. The semiconductor stack 201 includes a first semiconductor layer 2011, an active layer 2012 on the first semiconductor layer 2011, and a second semiconductor layer 2013 on the active layer 2012. In another embodiment, the semiconductor stack 201 can be formed on the wafer substrate 200 by wafer transfer technology. The semiconductor stack 201 and the wafer substrate 200 can be bonded by an interlayer, such as glue or dielectric material. In the embodiment, a first electrode 2014 is formed on the first semiconductor layer 2011 and a second electrode 2015 is formed on the second semiconductor layer 2013. In another embodiment, the first electrode 2014 can be formed on the bottom surface 200b of the wafer substrate 200. The shape of the wafer 2000 is not limited to a circle; a shape or size that can be divided by the method can also be included in the present disclosure.

In the step of applying a mesa process, a portion of the semiconductor stack 201 can be removed to form one or a plurality of trenches 201b and mesas of the semiconductor stack 201. The trench 201b includes a bottom surface. The bottom surface of the trench 201b and a projective region to the bottom surface 200b of the wafer 2000 are defined as a predetermined scribing region 211R. The mesa process can be applied after forming the semiconductor stack 201. As shown in FIGS. 1C and 1D, the second semiconductor layer 2013 and the active layer 2012 are partially etched and removed by a photolithography and an etching process such as inductively coupled plasma (ICP) etching, and a portion of the first semiconductor layer 2011 is exposed to form the trench 201b in the mesa process. In the embodiment, the exposed surface of first semiconductor layer 2011 is the bottom surface of the trench 201b. The exposed surface of first semiconductor layer 2011 and its projective region are defined as the predetermined scribing region 211R. In another embodiment, the first semiconductor layer 2011 can be further etched to expose the wafer substrate 200 in the mesa process to form the trench 201b. As shown in FIG. 1D, a predetermined scribing surface 211 is defined between the two mesas of the semiconductor stack 201. The predetermined scribing surface 211 has two intersections with the bottom surface of the trench 201b and a cross-sectional surface of the wafer substrate 200, and the intersections can be defined as a predetermined scribing line 211a. In the embodiment, the predetermined scribing surface 211 is defined at the middle of the predetermined scribing region 211R. In other word, the predetermined scribing line 211a is at the middle of the predetermined scribing region 211R which is the bottom surface of the trench 201b from a top view. The trench 201b can be formed in the wafer 2000 in the longitudinal direction A and/or in a transverse direction C from a top view and the predetermined scribing region 211R, the predetermined scribing surface 211, and the predetermined scribing are accordingly defined. A plurality of trench 201b can be formed in vertically interlaced throughout the wafer 2000 and a plurality of light emitting units is defined by a plurality of predetermined scribing surfaces 211 as shown in FIGS. 1B-1D. A wafer flat side S as shown in FIG. 1B can be an alignment, the trenches 201b are formed by aligning with the wafer flat side S in the longitudinal direction A or the transverse direction C. In the embodiment, the plurality of the trenches 201b are perpendicular and parallel to the wafer flat side S. In another embodiment, the plurality of trenches 201b can be formed in obliquely interlaced. The predetermined scribing region 211R is a region where used as a buffer region to make sure the semiconductor stack 201, especially the active layer 2012, will not be damaged during the breaking process.

A width of the predetermined scribing region 211R is 1-60 µm. In the embodiment, a width of the predetermined scribing region 211R is 20 µm. In another embodiment, a portion of the wafer substrate 200 can be exposed to form the trench 201b, a width of a top portion of the trench 201b is 24-30 µm and a width of a bottom portion of the predetermined scribing region 211R, which is the exposed wafer substrate 200, is about 18-20 µm. The predetermined scribing region 211R can prevent damages of the semiconductor stack 201 causing by cracks in the breaking process later on.

Figure 1E:
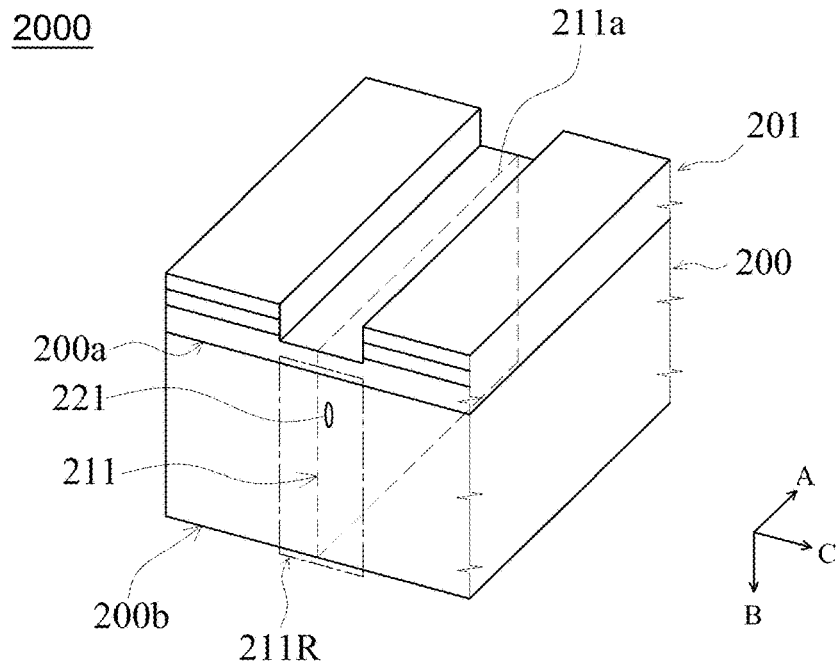

The step of applying a first laser process is proceeded after the mesa process, as shown in FIG. 1E. In the present embodiment, a laser beam irradiates from the top surface 200a side and into the predetermined scribing region 211R. A laser focus of the laser beam is at a first position in the wafer substrate 200 and then the laser beam affects and changes the characteristic of the wafer substrate 200, such as mechanical strength or transparency of the wafer substrate 200 to form a first deteriorated region 221 at the first position by the laser beam treatment. In the embodiment, the first position is at a first side of the predetermined scribing surface 211 in the predetermined scribing region 211R. A first depth is defined from the top surface 200a to a bottom edge of the first deteriorated region 221. A first distance is defined from the predetermined scribing surface 211 to a center of the first deteriorated region 221. In the embodiment, the first depth can be 40 µm, and the first distance can be 2 µm. In another embodiment, the laser beam can irradiate from the bottom surface 200b side, and the first depth can be defined from the bottom surface 200b to an upper edge of the first deteriorated region 221.

Figure 1F:
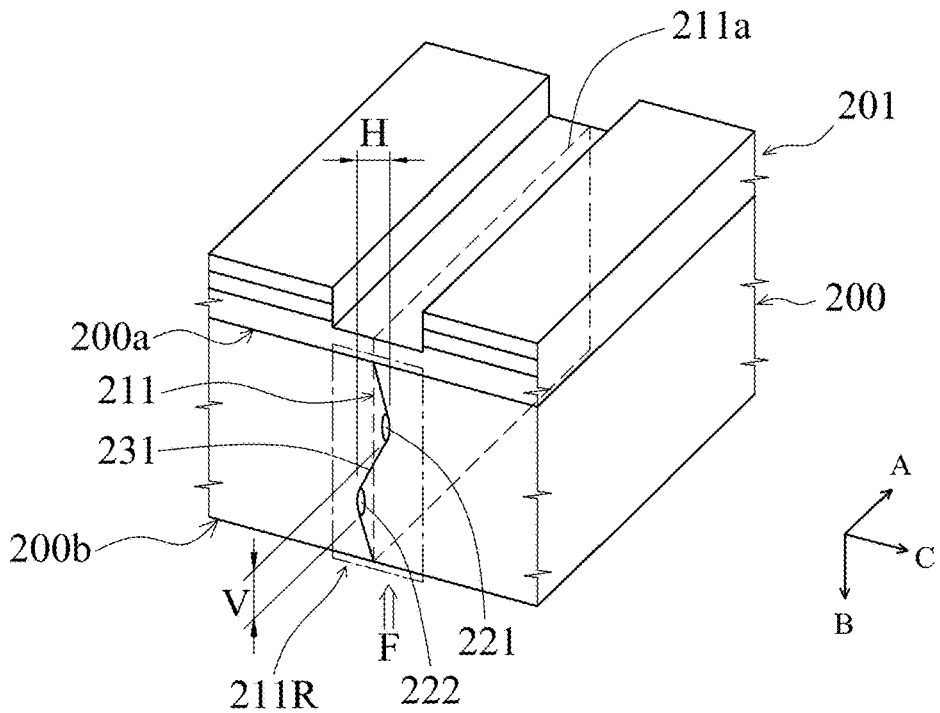
Figure 1G:
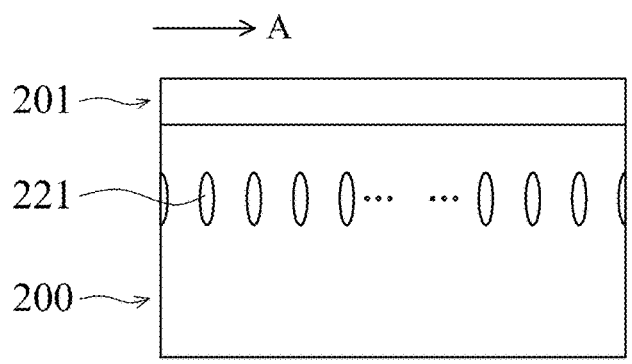

Referring to FIG. 1G which is a cross-sectional view of a plurality of the first deteriorated regions 221 through the transverse direction C. After forming the first deteriorated regions 221 at the first position, the laser focus is shifted from the first position to the following positions in the predetermined scribing region 211R along the longitudinal direction A at the first depth and the first distance, and repeat the first laser process to form the plurality of first deteriorated regions 221 located on a first vertical plane from a cross-sectional view. In the embodiment, the laser focus can be shifted along the longitudinal direction A by shifting the laser beam or the wafer 2000.

FIG. 1F illustrates the following step of applying a second laser process to form one or a plurality of second deteriorated regions 222 in accordance with the first embodiment. As shown in FIG. 1F, after the step of applying the first laser process, the laser focus can be shifted to a second side of the predetermined scribing surface 211, which is opposite to the first side of the predetermined scribing surface 211. The laser beam irradiates from the top surface 200a side and focuses at a second position of the predetermined scribing region 211R in the wafer substrate 200. The second position is at the second side of the predetermined scribing surface 211 opposite the first position of the first deteriorated region 221. A second deteriorated region 222 is formed at the second position by the laser beam treatment. A second depth is defined from the top surface 200a to a bottom edge of the second deteriorated region 222. A second distance is defined from the predetermined scribing surface 211 to a center of the second deteriorated region 222. In the embodiment, the second depth is deeper than the first depth in a thickness direction B, and the second distance is substantially the same as the first distance. Then the laser focus is shifted from the second position to the following positions in the predetermined scribing region 211R along the longitudinal direction A, at the second depth and the second distance, and repeat the second laser process to form the plurality of second deteriorated regions 222 on a second vertical plane from a cross-sectional view as shown in FIG. 1H. In the embodiment, the second depth of the second deteriorated region 222 from the top surface 200a to a bottom edge of the second deteriorated region 222 can be 60 µm and the second distance of the second deteriorated region 222 from the predetermined scribing surface 211 to a center of the second deteriorated region 222 can be 2 µm.

Referring to FIG. 1F, a horizontal distance H is defined from the center of the first deteriorated region 221 to a vertical line crossing the center of the second deteriorated region 222, and a vertical distance V is defined from the bottom edge of the first deteriorated region 221 to the bottom edge of the second deteriorated region 222. In the embodiment, the horizontal distance H is 4 µm, and the vertical distance V is 20 µm. The length of each one of the first deteriorated regions 221 or the second deteriorated regions 222 is 10 µm. In one embodiment, a horizontal distance H can be 1 µm~30 µm, and a vertical distance V can be 1 µm~30 µm. A length of each one of the first deteriorated regions 221 or the second deteriorated regions 222 can be 1 µm~30 µm. The length of the deteriorated regions is adjustable according to the pulse duration and the output power of the laser beam. In the embodiment, the first deteriorated region 221 and the second deteriorated region 222 are on the first vertical plane and the second vertical plane from the cross-sectional views, in other words, they are in different vertical planes. The first deteriorated region 221 and the second deteriorated region 222 are in an opposite side of the predetermined scribing surface 211 to make sure the semiconductor stack 201, especially the active layer 2012, will not be damaged by the cracks in the following breaking process.

Then, as shown in FIG. 1F, a breaking force F is provided and presses on the bottom surface 200b to divide the wafer 2000 into light emitting devices including at least the first light emitting device 2000' and the second light emitting device 2000". In one embodiment, the breaking force F is provided from the bottom surface 200b side and presses on the bottom surface 200b in the predetermined scribing region 211R. In one embodiment, the breaking force F is applied in alignment with the predetermined scribing line 211a. In another embodiment, the breaking force F is provided from the top surface 200a side and presses on the bottom surface of the trench 201b in the predetermined scribing region 211R.

When applying the breaking force F on the bottom surface 200b, the wafer substrate 200 is compressed, and breaks without complete separation of parts, and one or a plurality of first cracks 231 is formed thereafter. In one embodiment, the first crack 231 can be formed naturally according to the lattice structure of the wafer substrate 200 during or after forming the first deteriorated region 221 and the second deteriorated region 222 in the first laser process and the second laser process. The plurality of first cracks 231 extends between and connects with the first deteriorated regions 221 and the second deteriorated regions 222, the first deteriorated regions 221 and the top surface 200a, and the second deteriorated regions 222 and the bottom surface 200b respectively to form a real scribing surface. In the present embodiment, the plurality of first cracks 231 is formed by the breaking force F. One or the plurality of first cracks 231 has a cross with the predetermined scribing surface 211 since the first deteriorated region 221 and the second deteriorated region 222 are located alternatively in an opposite side of the predetermined scribing surface 211 caused by an alternative laser process including the first and the second laser processes described above. The alternative laser process, which forms the first deteriorated region 221 at the first position and shifts the laser focus from the first position to the second position by shifting the laser beam or the wafer 2000 for the horizontal distance H and the vertical distance V to form the second deteriorated region 222, can make sure that the real scribing surface cannot extend outside the predetermined scribing region 211R to damage the semiconductor stack 201, and thus enhance the yield rate and reliability of the light emitting devices after the breaking process.

As shown in FIGS. 1I(a)-1I(c), the first light emitting device 2000' and the second light emitting device 2000" are formed after the breaking process. Referring to FIG. 1I(a), the first light emitting device 2000' includes a first substrate 200' and a first semiconductor stack 201' formed on the first substrate 200'; wherein the first substrate 200' includes a top surface 200a', a bottom surface 200b' and a first side surface 200c connecting the top surface 200a' and the bottom surface 200b', and the first semiconductor stack 201' is formed on the top surface 200a'. The first side surface 200c includes the first deteriorated regions 221, the second deteriorated regions 222, and the first cracks 231 connecting the first deteriorated regions 221 and the second deteriorated regions 222. The first side surface 200c is one of the real scribing surface. The first cracks 231 can extend between and connect the first deteriorated regions 221 and the top surface 200a', and the second deteriorated regions 222 and the bottom surface 200b' respectively. The first deteriorated region 221 and the second deteriorated region 222 are in different vertical planes as shown in FIGS. 1G, 1H, 1I(a). The first side surface 200c includes a concave-convex surface. The concave-convex surface includes a concave-convex structure formed by the first deteriorated regions 221, the second deteriorated regions 222 and the first cracks 231. Referring to FIG. 1I(a), the concave-convex structure includes a convex region 240 and a concave region 250. The convex region 240 is composed by the first cracks 231 and the first deteriorated regions 221. The concave region 250 is composed by the first cracks 231 and the second deteriorated regions 222. There is a horizontal distance H' between a top of the convex region 240 and a vertical line crossing the bottom of the concave region 250. In the embodiment, the top of the convex region 240 is the first deteriorated region 221, and the bottom of the concave region 250 is the second deteriorated region 222. The horizontal distance H' is substantially the same as the horizontal distance H. In the present embodiment, the horizontal distance H' is 4 µm. In other embodiment, the horizontal distance H' can be 1~30 µm. According to the concave-convex structure, the light extraction of the first light emitting device 2000' and the second light emitting device 2000" can be enhanced. Referring to FIG. 1I(c), the second light emitting device 2000" is similar as the first light emitting device 2000'. The second light emitting device 2000" includes a second substrate 200" and a second semiconductor stack 201". The second substrate 200" includes a second side surface 200c' including the first deteriorated region 221, the second deteriorated region 222, and the first cracks 231. The second light emitting device 2000" is a complementary part of the first light emitting device 2000'. Therefore, a concave-convex structure of the second light emitting device 2000" is opposite to that of the first light emitting device 2000'. In other embodiments of the present disclosure, the concave-convex structure can be formed in other side surfaces of the first substrates 200' and second substrate 200". In other embodiments, the concave-convex structure can be formed in other side surfaces of the first substrates 200' and the second substrate 200". Therefore, each of the light emitting devices 2000', 2000" of the first embodiment can include four concave-convex side surfaces with the concave-convex structure. The shape of the light emitting devices 2000', 2000" is not limited to rectangle; a shape such as square, diamond, triangular or hexagonal can also be included in the present disclosure.

Figure 2A:
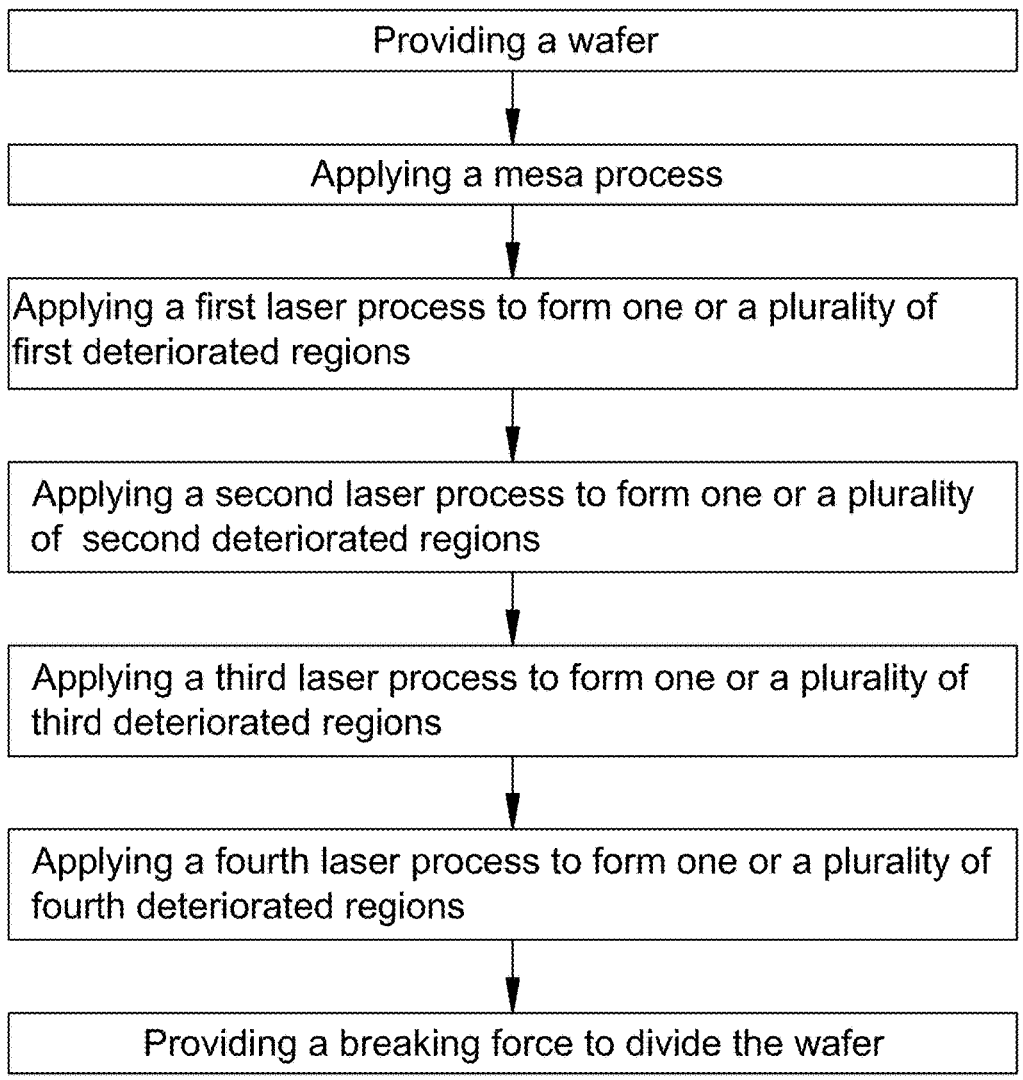
FIG. 2A is a process flow of a method for fabricating light emitting devices in accordance with one embodiment of the present disclosure.
Figure 2B:
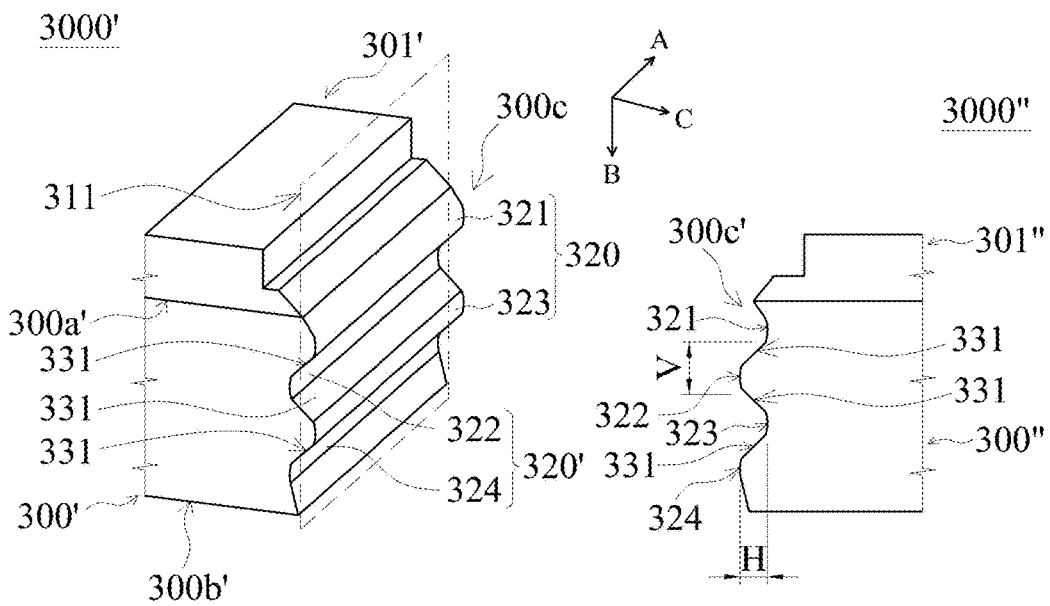
FIGS. 2B(a)-2B(b) are a perspective view of a first light emitting device, and a cross-sectional view of a second light emitting devices through a direction A in accordance with one embodiment of the present disclosure.
Figure 2C:
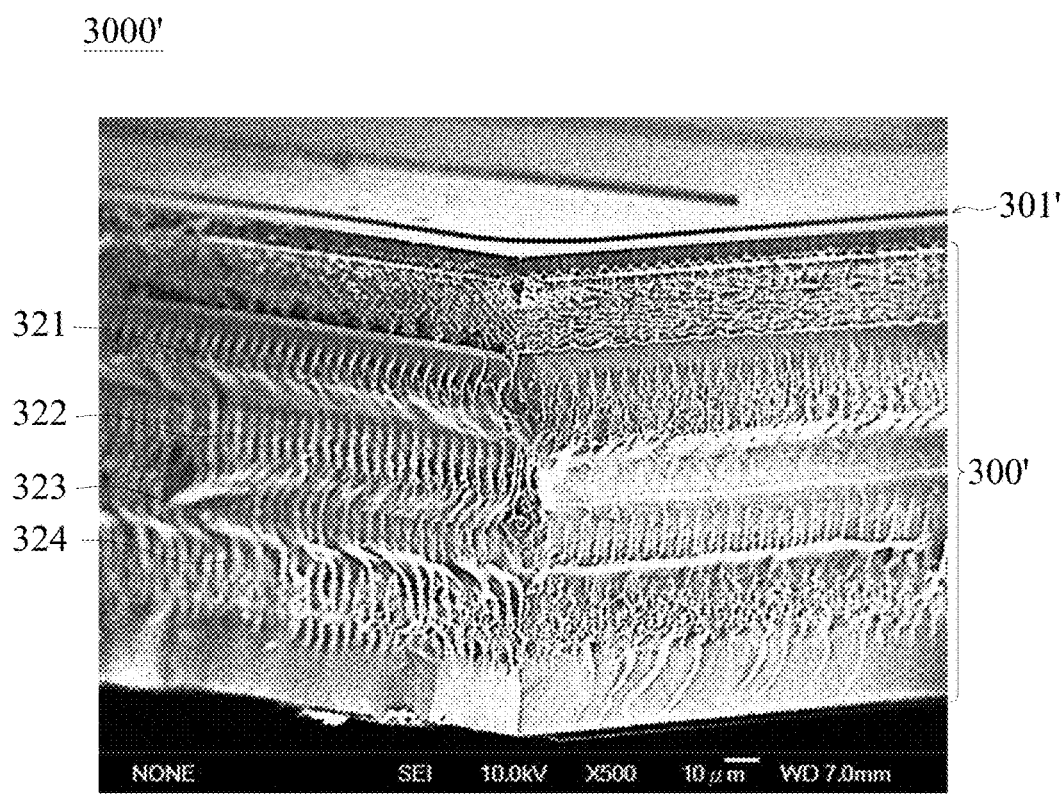
FIG. 2C is an SEM image of a partial enlargement perspective view of a light emitting device in accordance with one embodiment of the present disclosure.

FIGS. 2A-2C illustrate a method of manufacturing light emitting devices 3000' and 3000" in accordance with a second embodiment of the present disclosure. As shown in FIG. 2A, in the second embodiment, the steps of providing a wafer, applying a mesa process, applying a first laser process to form one or a plurality of first deteriorated regions, applying a second laser process to form one or a plurality of second deteriorated regions, and providing a breaking force to divide the wafer are similar to the steps of the first embodiment. The steps of the second embodiment further include alternatively applying a third laser process and a fourth laser process. In the first laser process and the second process, as in the first embodiment, one or a plurality of first deteriorated regions 321 are formed at a first position of a first side of a predetermined scribing surface 311, and one or a plurality of second deteriorated regions 322 are formed at a second position of a second side of the predetermined scribing surface 311. The first position and the second position are the position of the laser focus. Each of the first deteriorated regions 321 is located at a first depth defined from the top surface 300a' to a bottom edge of the first deteriorated region 321 and a first distance defined from the predetermined scribing surface 311 to a center of the first deteriorated region 321. Each of the second deteriorated regions 322 is located at a second depth defined from the top surface 300a' to a bottom edge of the second deteriorated region 322 and a second distance defined from the predetermined scribing surface 311 to a center of the second deteriorated region 322. The first deteriorated regions 321 and the second deteriorated regions 322 are in an opposite side of the predetermined scribing surface 311.

After the step of applying the second laser process, the laser focus can be shifted to the first side of the predetermined scribing surface 311 where the first deteriorated regions 321 are located. The laser beam irradiates from the top surface 300a side and focuses at a third position in a wafer substrate which is the former of a first substrate 300' and a second substrate 300" before the breaking process. The third position is at the first side of the predetermined scribing surface 311 opposite the second position and the second deteriorated region 322, and a third deteriorated region 323 is formed at the third position by the laser beam treatment. In the embodiment, a third depth defined from the top surface 300a' to a bottom edge of the third deteriorated region 323 is deeper than that of the first and second deteriorated regions 321, 322 in a thickness direction B, and a third distance defined from the predetermined scribing surface 311 to a center of the third deteriorated region 323 is substantially the same as the first distance from the predetermined scribing surface 311 to the center of first deteriorated region 321.

In the embodiment, the third depth of the third deteriorated region 323 from the top surface 300a' to a bottom edge of the third deteriorated region 323 can be 80 μm and the third distance can be 2 μm. In one embodiment, the third depth can be counted from the bottom surface 300b to an upper edge of the third deteriorated region 323 when the laser beam irradiates from the bottom surface 300b' side.

After the step of applying the third laser process, the laser focus can be shifted to the second side of the predetermined scribing surface 311 where the second deteriorated regions 322 are located. The laser beam irradiates from the top surface 300a' side and focuses at a fourth position in the wafer substrate. The fourth position is at the second side of the predetermined scribing surface 311 opposite the third position and the third deteriorated region 323. A fourth deteriorated region 324 is formed at the fourth position by the laser beam treatment. In the embodiment, a fourth depth defined from the top surface 300a' to a bottom edge of the fourth deteriorated region 324 is deeper than that of the first, second and third deteriorated regions 321, 322, 323 in a thickness direction B, and a fourth distance from the predetermined scribing surface 311 to a center of the fourth deteriorated region 324 in substantially the same as the second distance from the predetermined scribing surface 311 to the second deteriorated regions 322.

In the present embodiment, the fourth depth of the fourth deteriorated region 324 from the top surface 300a' to a bottom edge of the fourth deteriorated region 324 can be 100 μm and the fourth distance can be 2 μm. In one embodiment, the fourth depth can be counted from the bottom surface 300b to an upper edge of the fourth deteriorated region 324 when the laser beam irradiates from the bottom surface 300b' side.

Referring to FIG. 2B, before separating the first and second light emitting devices 3000' and 3000", a horizontal distance H is defined from the center of the first deteriorated region 321 to a vertical line crossing that of the second deteriorated region 322, or from the center of the third deteriorated region 323 to a vertical line crossing that of the fourth deteriorated region 324. A vertical distance V is defined from the bottom edge of the first deteriorated region 321 to the bottom edge of the second deteriorated region 322, from the bottom edge of the second deteriorated region 322 to the bottom edge of the third deteriorated region 323, or from the bottom edge of the third deteriorated region 323 to the bottom edge of the fourth deteriorated region 324. In the embodiment, the horizontal distance H is 4 μm, and the vertical distance V is 20 μm. The length of each one of the deteriorated regions is 10 μm. In one embodiment, the horizontal distance H can be 1 μm~30 μm, and the vertical distance V can be 1 μm~30 μm. The length of each one of the deteriorated regions can be 1 μm~30 μm. The length of the deteriorated regions is controlled by the pulse duration and the output power of the laser beam. In the present embodiment, the first deteriorated region 321 and the third deteriorated region 323 are in the first vertical plane, and the second deteriorated region 322 and the fourth deteriorated region 324 are in the second vertical plane. Therefore, the first deteriorated region 321, the second deteriorated region 322, the third deteriorated region 323, and the fourth deteriorated region 324 are alternatively located in opposite sides of the predetermined scribing surface 311 to make sure the semiconductor stack 301', 301" will not be damaged in the following breaking process.

Then, the breaking process is substantially the same processes of the first embodiment, a breaking force is provided and presses on the bottom surface of the wafer substrate to divide the wafer into light emitting devices including at least the first light emitting device 3000' and the second light emitting device 3000".

As shown in FIGS. 2B(a)-2B(b), the first light emitting device 3000' and the second light emitting device 3000" are formed after the breaking process. Referring to FIG. 2B(a), the first light emitting device 3000' includes a first substrate 300' and first semiconductor stack 301' formed on the first substrate 300', wherein the first substrate 300' includes a top surface 300a', a bottom surface 300b' and a first side surface 300c connecting the top surface 300a' and the bottom surface 300b', and the first semiconductor stack 301' is formed on the top surface 300a'. The first side surface 300c includes the first deteriorated region 321, the second deteriorated region 322, the third deteriorated region 323, the fourth deteriorated region 324, and a first cracks 331 extending between and connecting the first deteriorated region 321 and the second deteriorated region 322, the second deteriorated region 322 and the third deteriorated region 323, and the third deteriorated region 323 and the fourth deteriorated region 324. The first cracks 331 can extend between and connect the first deteriorated region 321 and the top surface 300a', and the fourth deteriorated region 324 and the bottom surface 300b'. The first deteriorated region 321 and the third deteriorated region 323 are on a same first vertical plane. The second deteriorated region 322 and the fourth deteriorated region 324 are on a same second vertical plane. The first vertical plane is different from the second vertical plane. The first side surface 300c includes a concave-convex surface. The concave-convex surface includes a concave-convex structure including at least a convex region and a concave region formed by the first deteriorated region 321, the second deteriorated region 322, the third deteriorated region 323, the fourth deteriorated region 324, and the first cracks 331. The one or the plurality of first deteriorated regions 321 and the one or the plurality of third deteriorated regions 323 are formed on a top of the convex region. The one or the plurality of second deteriorated regions 322 and the one or the plurality of fourth deteriorated regions 324 are formed on a bottom of the concave region. According to the concave-convex structure, the light extraction of the first light emitting device 3000' can be enhanced. Referring to FIG. 2B(b), the second light emitting device 3000'' is similar as the first light emitting device 3000'. The second light emitting device 3000'' includes a second substrate 300'' and a second semiconductor stack 301''. The second substrate 300'' includes a second side surface 300c' including the first deteriorated region 321, the second deteriorated region 322, the third deteriorated region 323, the fourth deteriorated region 324, and the first cracks 331. The second light emitting device 3000'' is a complementary part of the first light emitting device 3000'. Therefore, a concave-convex structure of the second light emitting device 3000'' is opposite to that of the first light emitting device 3000'. In other embodiments of the present disclosure, the concave-convex structure can be formed in other side surfaces of the first substrates 300' and second substrate 300''. Therefore, each of the light emitting device 3000', 3000'' of the second embodiment can include four concave-convex side surfaces with the concave-convex structure. The shape of the light emitting device 3000', 3000'' is not limited to rectangle; a shape such as square, diamond, triangular or hexagonal can also be included in the present disclosure.

In another embodiment, the sequence of steps of applying the first laser process, the second laser process, the third laser process and the fourth laser process are exchangeable.

FIG. 2C is a SEM image of a partial enlargement perspective view of a light emitting device 3000' of the second embodiment. As shown in FIG. 2C, the light emitting device 3000' includes the first substrate 300', the first semiconductor stack 301', the first deteriorated region 321, the second deteriorated region 322, the third deteriorated region 323 and the fourth deteriorated region 324. The light emitting device 3000' includes a plurality of concave-convex side surfaces. The concave-convex surface includes a plurality of concave-convex structures can enhance light extraction of the light emitting device 3000'.

Figure 2D:
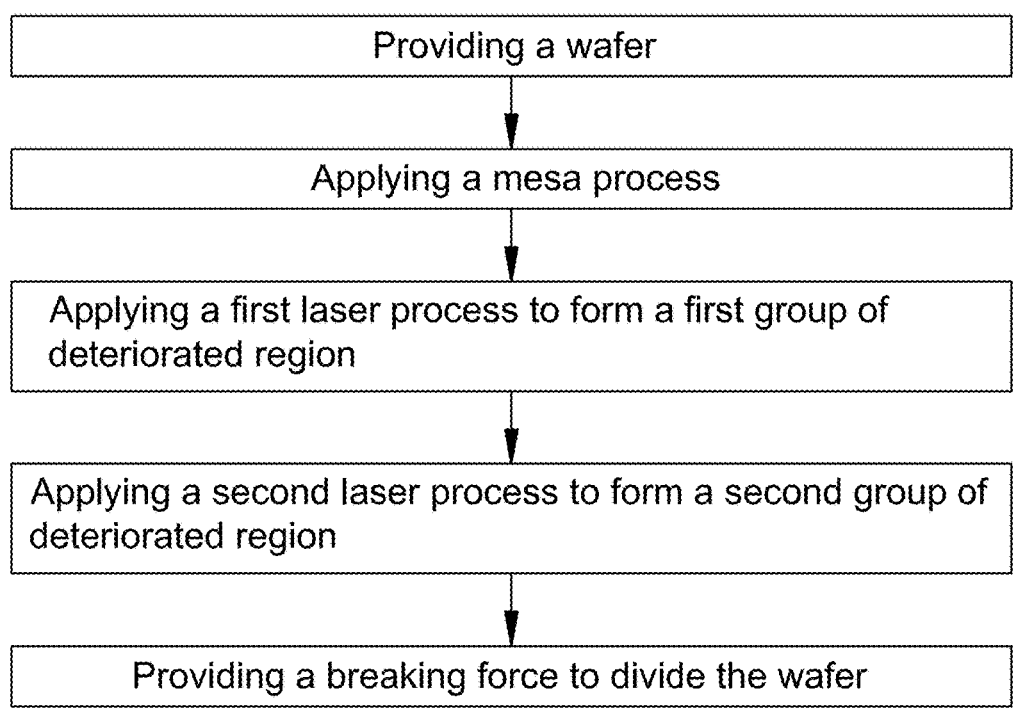
FIG. 2D is a process flow of a method for fabricating light emitting devices in accordance with one embodiment of the present disclosure.

In another embodiment with different process, as shown in FIG. 2D, the laser can be a multiple beam laser, such as a dual-beam laser or a single beam laser with a splitter to form multiple deteriorated regions at a same time in a same laser process and thus enhance the efficiency of the laser process. Therefore, a first group of deteriorated region 320 can be formed at the first side of the predetermined scribing surface 311 at a same time in a first laser process by the multiple beam lasers. A second group of deteriorated region 320' can be formed in the second side of the predetermined scribing surface 311 at a same time in a second laser process by the multiple beam lasers. In the embodiment, the first group of deteriorated region 320 includes the first deteriorated region 321 and the third deteriorated region 323. The second group of deteriorated region 320' includes the second deteriorated region 322 and the fourth deteriorated region 324, as shown in FIG. 2B(a). In one embodiment, the first group of deteriorated region 320 can only include one of the first deteriorated region 321 or the third deteriorated region 323, the second group of deteriorated region 320' can only include one of the second deteriorated region 322 or the fourth deteriorated region 324.

Figure 3A:
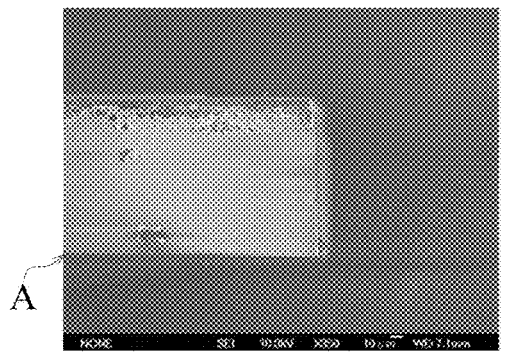
FIGS. 3A-3D are SEM side-viewed images of four light emitting devices in accordance with embodiments of the present disclosure.
Figure 3B:
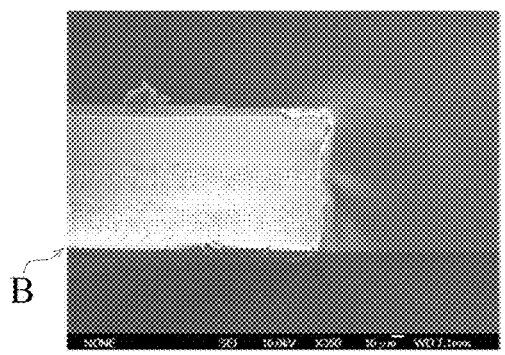
Figure 3C:
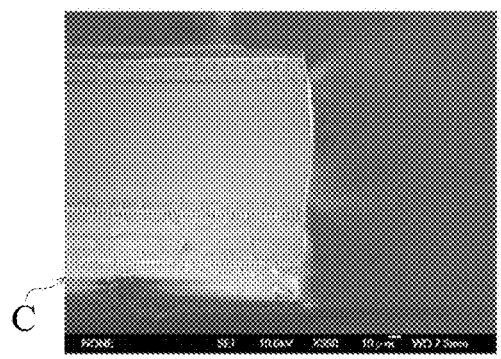
Figure 3D:
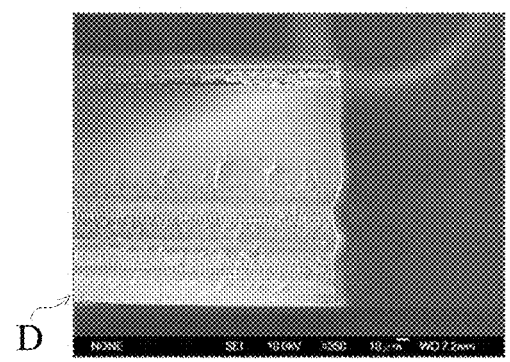

FIGS. 3A-3D show SEM side-viewed images of four light emitting devices. The four light emitting devices are formed by method of laser process. In the embodiments, the four light emitting devices are GaN based LEDs with sapphire substrates. As shown in FIG. 3A, a LED A is formed by a laser process with a nanosecond laser. In the LED A, the thickness of the sapphire substrate is about 120 um. The nanosecond laser beam irradiates from the top surface of the sapphire substrate for separating. After the laser process, a side surface of the sapphire substrate includes a roughening region extending a depth from the top surface, and the other side surface of the sapphire substrate is substantially flat. As shown in FIG. 3B, a LED B is formed by a dual-beam laser process with the picosecond laser. In the LED B, the thickness of the sapphire substrate is about 120 um. The picosecond laser beam irradiates from the bottom surface of the sapphire substrate, a plurality of first and second deteriorated regions are formed on the side surface of the sapphire substrate on a same vertical plane. The parts of the side surface, between the top surface and the first deteriorated regions, the first and the second deteriorated regions, and the second deteriorated regions and the bottom surface are flat. As shown in FIG. 3C, a LED C is formed by a dual-beam laser process with the picosecond laser. In the LED C, the thickness of the sapphire substrate is about 200 um. The picosecond laser beam irradiates from the bottom surface of the sapphire substrate, similar as the LED B, there are a plurality of first and second deteriorated regions on the side surface of the sapphire substrate on a same vertical plane. One of the differences is the side surface, a distance between the top surface and the first deteriorated regions of the side surface of the LED C is larger than a distance between the top surface and the first deteriorated regions of the side surface of the LED B. As shown in FIG. 3D, a LED D is formed by an alternative laser process in accordance with one embodiment of the present disclosure. In the LED D, the thickness of the sapphire substrate is about 200 um. After the alternative laser process, the side surface of the sapphire substrate includes a plurality of first, second, third, fourth deteriorated regions formed on the surface of the sapphire substrate. The sapphire substrate includes a concave-convex surface with a plurality of concave-convex structures. The four deteriorated regions compose the concave-convex structures. Under 120 mA current injection, the output powers of the LEDs A, B, C, D, are 132.14, 134.70, 136.23, and 139.11 mW respectively. There are no significant changes to the current-forward voltage characteristics of the four LEDs. Comparing with the LED A, the light output power of the LEDs B, C, D are improved by 1.94%, 3.10%, and 5.28% respectively. The light output power improvement is attributed to the side surface area increased and the roughing region of the side surfaces, especially the concave-convex surface formed by the alternative laser process.

Figures 4A, 4B:
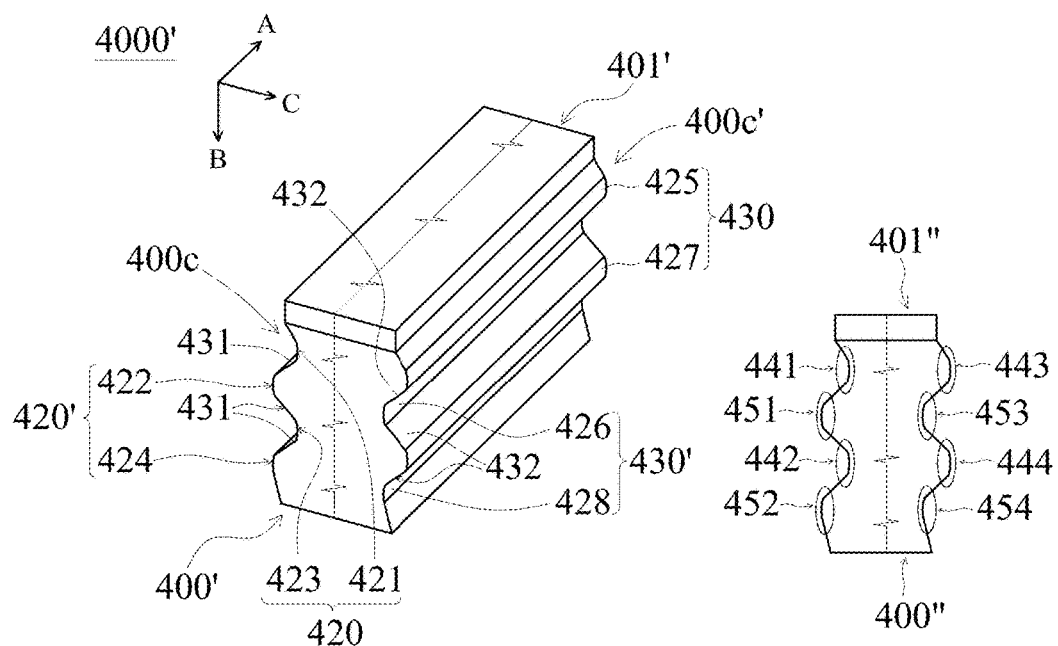
FIGS. 4A-4B are a perspective view of a first light emitting device and a cross-sectional view of the first light emitting device through a direction A in accordance with one embodiment of the present disclosure.

FIGS. 4A-4B illustrates a first light emitting device 4000' in accordance with a third embodiment of the present disclosure. As shown in FIG. 4A, the first light emitting device 4000' includes a first substrate 400', a first semiconductor stack 401', a first side surface 400c, and a second side surface 400c'. The first side surface 400c includes, a first group of deteriorated region 420, a second group of deteriorated region 420', and a plurality of first cracks 431 extending between and connecting the first group of deteriorated region 420 and the second group of deteriorated region 420'. The first group of deteriorated region 420 includes a first deteriorated region 421 and a third deteriorated region 423 formed on a first vertical plane. The second group of deteriorated region 420' includes a second deteriorated region 422 and a fourth deteriorated region 424 formed on a second vertical plane. The second side surface 400c' includes, a third group of deteriorated region 430, a fourth group of deteriorated region 430', and a plurality of second cracks 432 extending between and connecting the third group of deteriorated region 430 and fourth group of deteriorated region 430'. The third group of deteriorated region 430 includes a fifth deteriorated region 425 and a seventh deteriorated region 427 formed on a third vertical plane. The fourth group of deteriorated region 430' includes a sixth deteriorated region 426 and an eighth deteriorated region 428 formed on a fourth vertical plane. In the embodiment, as shown in FIGS. 4A-4B, the first side surface 400c includes a first concave-convex surface. The first concave-convex surface includes a first concave-convex structure. The second side surface 400c' includes a second concave-convex surface. The second concave-convex side surface includes a second concave-convex structure. The first concave-convex structure includes a first group of concave region and a first group of convex region. The second concave-convex structure includes a second group of concave region and a second group of convex region. The first group of concave region includes a first concave region 441 and a second concave region 442, and the first group of convex region includes a first convex region 451 and a second convex region 452. A bottom of the first concave region 441 includes the one or the plurality of first deteriorated regions 421, and a top of the first convex region 451 includes the one or the plurality of second deteriorated regions 422. A bottom of the second concave region 442 includes the one or the plurality of third deteriorated regions 423, and a top of the second convex region 452 includes the one or the plurality of fourth deteriorated regions 424. A second group of convex region includes a third convex region 443 and a fourth convex region 444, and the second group of concave region includes a third concave region 453 and a fourth concave region 454. A top of the third convex region 443 includes the one or the plurality of fifth deteriorated regions 425, and a bottom of the third concave region 453 includes the one or the plurality of sixth deteriorated regions 426. A top of the fourth convex region 444 includes the one or the plurality of seventh deteriorated regions 427, and a bottom of the fourth concave region 454 includes the one or the plurality of eighth deteriorated regions 428. The four deteriorated regions 421-424, and the first cracks 431 compose the first concave-convex structure on the first side surface 400c. The four deteriorated regions 425-428, and the second cracks 432 compose the second concave-convex structures on the second side surface 400c'. The first side surface 400c and the second side surface 400c' are concave-convex surfaces. In the embodiment, the first convex region 451 and the third concave region 453 are co-plane, and the first concave region 441 and the third convex region 443 are co-plane, the second convex region 452 and the fourth concave region 454 are co-plane, and the second concave region 442 and the fourth convex region 444 are co-plane.

The laser process and the breaking process are made by similar processes of the first or the second embodiment. In the embodiment, as shown in FIG. 4A, the first group of deteriorated region 420 is in alignment with the third group of deteriorated region 430 on the same horizontal plane, the second group of deteriorated region 420' is in alignment with the fourth group of deteriorated region 430' on the same horizontal plane. The four deteriorated regions 421-424 of the first side surface 400c are in alignment with the four deteriorated regions 425-428 of the second side surface 400c' on the same horizontal planes respectively.

It is also shown in FIG. 4A that, the first group of deteriorated region 420 and the fourth group of deteriorated region 430' are located at concave regions of the first side surface 400c and second side surface 400c' respectively. The second group of deteriorated region 420' and the third group of deteriorated region 430 are located at convex regions of the first side surface 400c and second side surface 400c' respectively.

In the present embodiment, the first side surface 400c and the second side surface 400c' can be formed in other side of the first substrate 400'. Therefore, the light emitting device 4000' of the present embodiment can include four side surfaces, each of the four side surfaces includes a surface shape of the first side surface 400c or that of the second side surface 400c'. The shape of the light emitting device 4000' is not limited to rectangle; a shape such as square, diamond, triangular or hexagonal can also be included in the present disclosure.

Figures 5A, 5B:
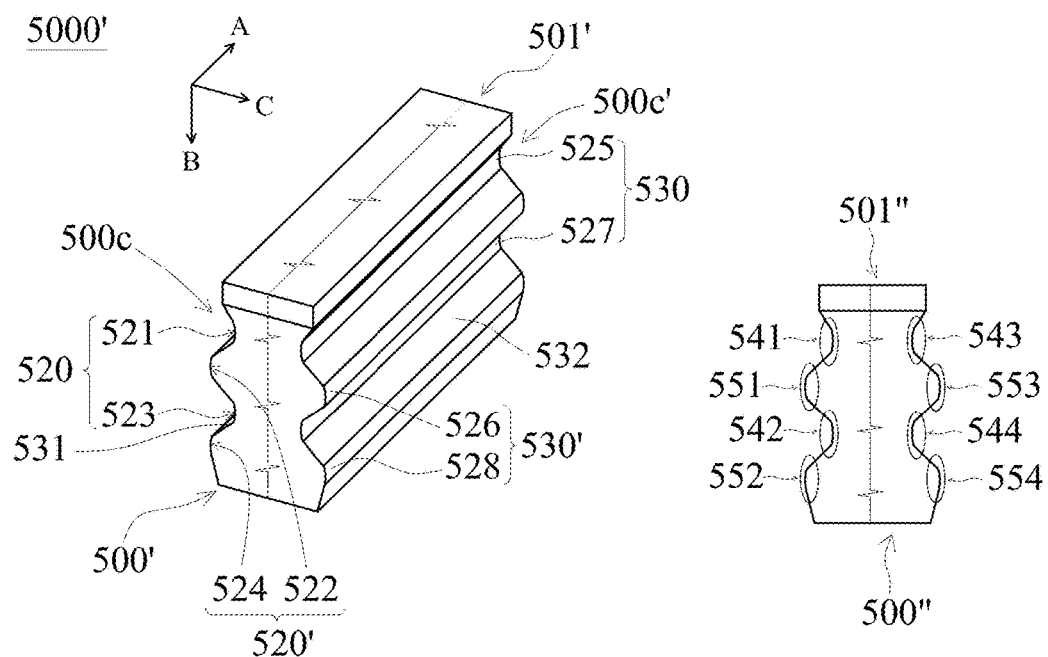
FIGS. 5A-5B are a perspective view of a first light emitting device and a cross-sectional view of the first light emitting device through a direction A in accordance with one embodiment of the present disclosure.

FIGS. 5A-5B illustrates a light emitting device 5000' in accordance with a fourth embodiment of the present disclosure. As shown in FIG. 5A, the light emitting device 5000' includes a first substrate 500', a first semiconductor stack 501', a first side surface 500c, and a second side surface 500c'. The first side surface 500c includes, a first group of deteriorated region 520, a second group of deteriorated region 520', and a plurality of first cracks 531 extending between and connecting the first group of deteriorated region 520 and the second group of deteriorated region 520'. The first group of deteriorated region 520 includes a first deteriorated region 521 and a third deteriorated region 523 formed on a first vertical plane. The second group of deteriorated region 520' includes a second deteriorated region 522 and a fourth deteriorated region 524 formed on a second vertical plane. The second side surface 500c' includes, a third group of deteriorated region 530, a fourth group of deteriorated region 530', and a plurality of second cracks 532 extending between and connecting the third group of deteriorated region 530 and fourth group of deteriorated region 530'. The third group of deteriorated region 530 includes a fifth deteriorated region 525 and a seventh deteriorated region 527 formed on a third vertical plane. The fourth group of deteriorated region 530' includes a sixth deteriorated region 526 and an eighth deteriorated region 528 formed on a fourth vertical plane. In the embodiment, as shown in FIGS. 5A-5B, the first side surface 500c includes a first concave-convex surface. The first concave-convex surface includes a first concave-convex structure. The second side surface 500c' includes a second concave-convex surface including a second concave-convex structure. The first concave-convex structure includes a first group of concave region and a first group of convex region. The second concave-convex structure includes a second group of concave region and a second group of convex region. The first group of concave region includes a first concave region 541 and a second concave region 542, and the first group of convex region includes a first convex region 551 and a second convex region 552. A bottom of the first concave region 541 includes the one or the plurality of first deteriorated regions 521, and a top of the first convex region 551 includes the one or the plurality of second deteriorated regions 522. A bottom of the second concave region 542 includes the one or the plurality of third deteriorated regions 523, and a top of the second convex region 552 includes the one or the plurality of fourth deteriorated regions 524. The second group of concave region includes a third concave region 543 and a fourth concave region 544, and the second group of convex region includes a third convex region 553 and a fourth convex region 554. A bottom of the third concave region 543 includes the one or the plurality of fifth deteriorated regions 525, a top of the third convex region 553 includes the one or the plurality of sixth deteriorated regions 526, a bottom of the fourth concave region 544 includes the one or the plurality of seventh deteriorated regions 527, and a top of the fourth convex region 554 includes the one or the plurality of eighth deteriorated regions 528. The four deteriorated regions 521-524, and the first cracks 531 compose the concave-convex structures on the first side surface 500c. The four deteriorated regions 525-528, and the second cracks 532 compose the concave-convex structures on the second side surface 500c'. The first side surface 500c and the second side surface 500c' are concave-convex surfaces. In the embodiment, the first convex region 551 and the third convex region 553 are co-plane, and the first concave region 541 and the third concave region 543 are co-plane. The second convex region 552 and the fourth convex region 554 are co-plane, and the second concave region 542 and the fourth concave region 544 are co-plane.

The laser process and the breaking process of the embodiment are similar to processes of the first or the second embodiment. In the embodiment, as shown in FIG. 5A, the first group of deteriorated region 520 is in alignment with the third group of deteriorated region 530 on the same horizontal planes, the second group of deteriorated region 520' is in alignment with the fourth group of deteriorated region 530' on the same horizontal planes. The four deteriorated regions 521-524 of the first side surface 500c are in alignment with the four deteriorated regions 525-528 of the second side surface 500c' on the same horizontal planes respectively.

It is also shown in FIG. 5A that, the first group of deteriorated region 520 and the third group of deteriorated region 530 are located at concave regions of the first side surface 500c and second side surface 500c' respectively. The second group of deteriorated region 520' and the fourth group of deteriorated region 530' are located at convex regions of the first side surface 500c and second side surface 500c' respectively.

In the present embodiment, the first side surface 500c and the second side surface 500c' can be formed in other side of the first substrate 500'. Therefore, the light emitting device 5000' of the present embodiment can include four side surfaces, each of the four side surfaces includes a surface shape of the first side surface 500c or that of the second side surface 500c'. The shape of the light emitting device 5000' is not limited to rectangle; a shape such as square, diamond, triangular or hexagonal can also be included in the present disclosure.

FIGS. 6A to 6H illustrate a method of manufacturing a light emitting device 6000 in accordance with the fifth embodiment of the present disclosure. The process flow of the fifth embodiment is as shown in FIG. 1A, which is the same as the process of the first embodiment. Furthermore, in the fifth embodiment, R-plane of the wafer substrate and the first crack surface between the first deteriorated regions and the second deteriorated regions form an angle α, wherein $45° \leq α \leq 135°$. The details of the steps are described as follows.

Figure 6A:
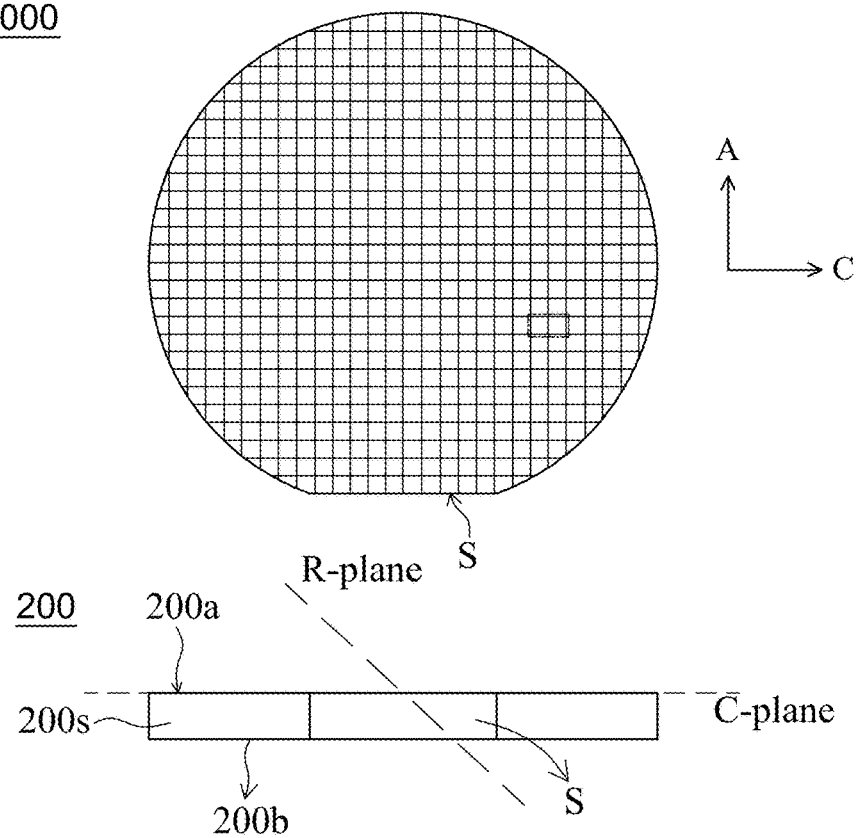
FIG. 6A shows a top view of a wafer and a side view of a wafer substrate of the wafer 2000 in accordance with one embodiment of the present disclosure.
Figure 6B:
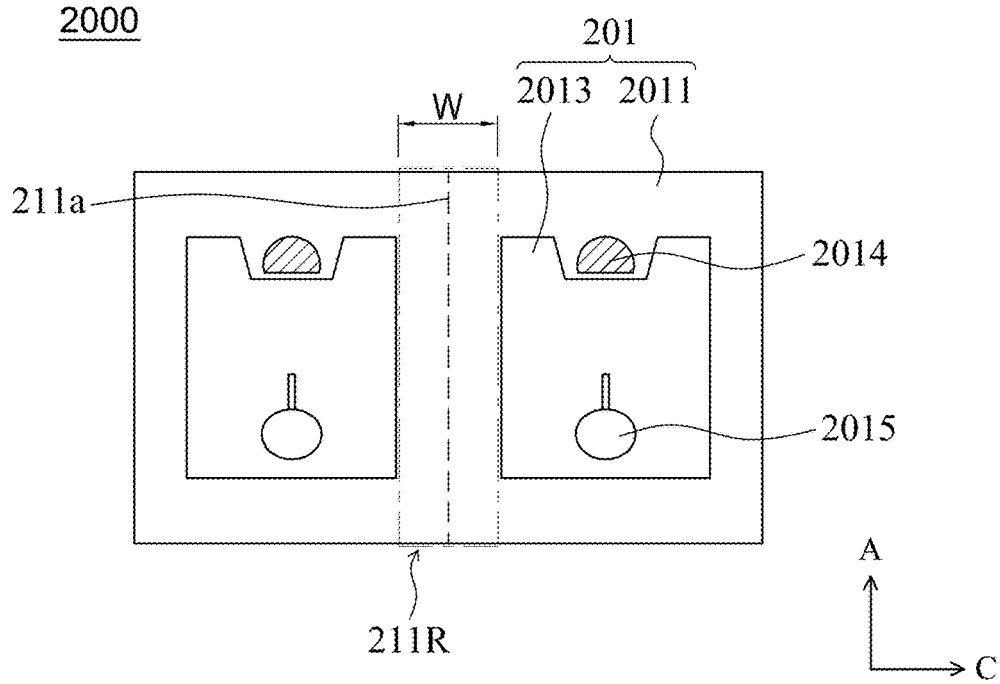
FIG. 6B shows a top view of a partial enlargement of the wafer embodiment.
Figure 6C:
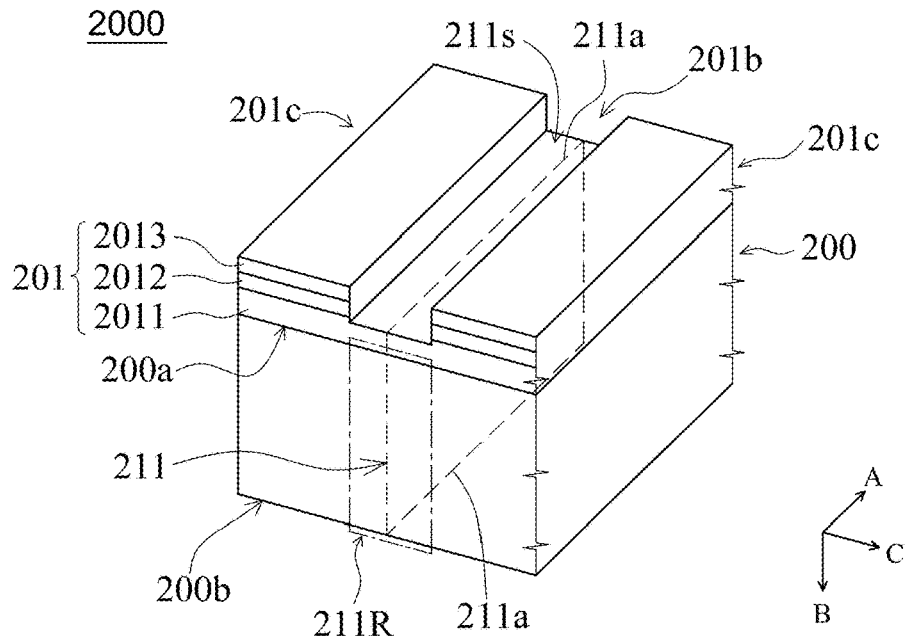
FIG. 6C shows a perspective view of the partial enlargement of the wafer in accordance with one embodiment of the present disclosure.

FIG. 6A shows a top view of a wafer 2000 and a side view of a wafer substrate 200 of the wafer 2000. FIG. 6B is a top view of a partial enlargement of the wafer 2000, and FIG. 6C is a perspective view of the partial enlargement of the wafer 2000. As shown in FIG. 6A, the wafer substrate 200 includes a top surface 200a, a bottom surface 200b, and a side surface 200s connecting the top surface 200a and the bottom surface 200b, wherein the side surface 200s includes a flat surface S.

Figure 7:
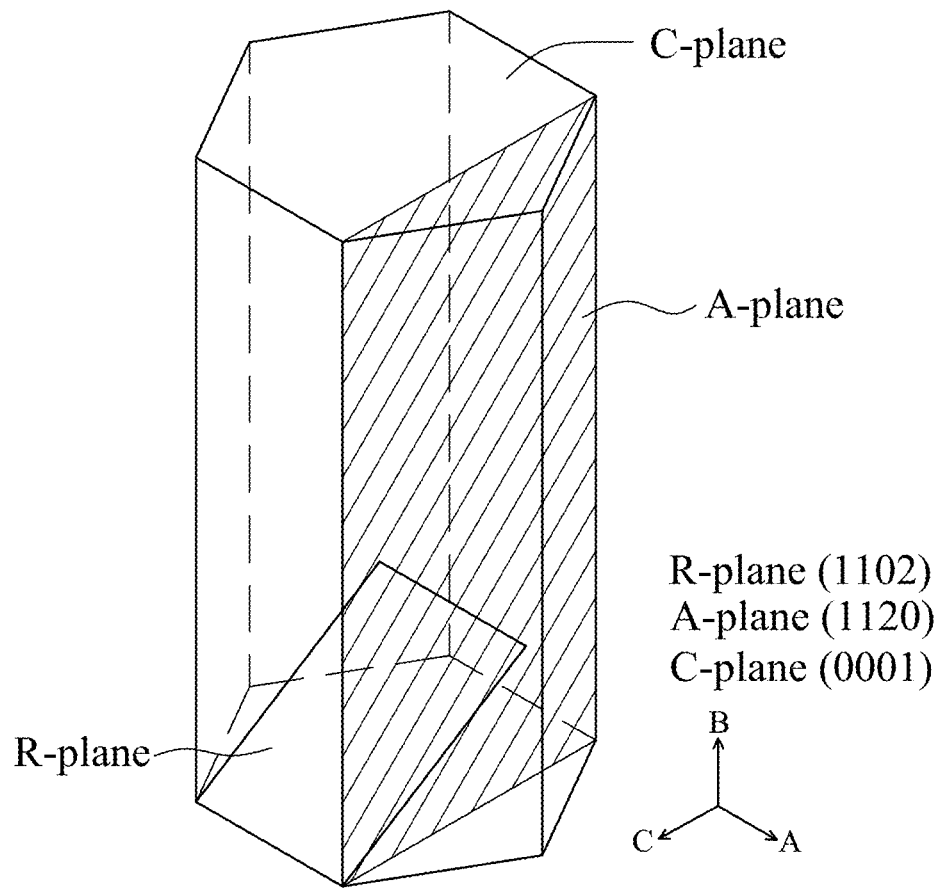
FIG. 7 shows a lattice structure of sapphire in accordance with one embodiment of the present disclosure.

As shown in FIGS. 6A to 6C, a semiconductor stack 201 formed on the top surface 200a of the wafer substrate 200. The semiconductor stack 201 includes a first semiconductor layer 2011, a second semiconductor layer 2013, and an active layer 2012 between the first semiconductor layer 2011 and the second semiconductor layer 2013. The semiconductor stack 201 can be formed on the wafer substrate 200 by epitaxy or bonding technology, such as metal bonding and glue bonding technologies. In addition, the semiconductor stack 201 and the wafer substrate 200 can be bonded by an interlayer, such as metal, dielectric material and transparent conductive material. In the embodiment as shown in FIG. 6B, a first electrode 2014 is formed on the first semiconductor layer 2011 and a second electrode 2015 is formed on the second semiconductor layer 2013. In some embodiments, the first electrode 2014 can be formed on the bottom surface 200b of the wafer substrate 200. According to the present disclosure, the material of the wafer substrate 200 is sapphire, which has lattice planes including C-plane, R-plane and A-plane, as shown in FIG. 7, wherein the top surface 200a is C-plane, and the R-plane is perpendicular to the flat surface S.

In the step of applying a mesa process, a portion of the semiconductor stack 201 can be removed to form multiple trenches 201b and multiple mesas 201c. The trench 201b includes a bottom surface 211s. A predetermined scribing region 211R is defined between the bottom surface 211s of the trench 201b and a projective region on the bottom surface 200b of the wafer 2000 corresponding to the bottom surface 211s. The mesa process can be applied after forming the semiconductor stack 201. As shown in FIGS. 6B and 6C, the second semiconductor layer 2013 and the active layer 2012 are partially etched and removed by a photolithography and an etching process, such as dry etching and wet etching methods, to form the trench 201b, and a portion of the first semiconductor layer 2011 is exposed to form the bottom surface 211s in the mesa process. In another embodiment, the first semiconductor layer 2011 can be further partially etched to expose the wafer substrate 200 in the mesa process to form the trench 201b. As shown in FIG. 6C, a predetermined scribing surface 211 is defined in the wafer 2000 and between the two mesas 201c of the semiconductor stack 201. The predetermined scribing surface 211 has multiple intersections with the bottom surface 211s of the trench 201b and with the bottom surface 200b of the wafer 2000, wherein the intersections can be defined as predetermined scribing lines 211a on the bottom surface 211s of the trench 201b and on the bottom surface 200b of the wafer 2000. As shown in FIGS. 6B and 6C, in the embodiment, the predetermined scribing surface 211 is defined to interlace with the middle of the predetermined scribing region 211R.

In other word, as shown in FIG. 6B, the predetermined scribing line 211a is at the middle of the bottom surface 211s of the trench 201b from a top view. The trench 201b can be formed along the longitudinal direction A and/or the transverse direction C from a top view, and the predetermined scribing region 211R, the predetermined scribing surface 211 and the predetermined scribing line 211a are accordingly defined. The multiple trenches 201b interlace throughout the wafer 2000 and multiple light emitting units are defined by the multiple predetermined scribing surfaces 211 as shown in FIGS. 6A to 6C. The flat side S, as shown in FIG. 6A, can be an alignment, and the trenches 201b are formed by aligning with the wafer flat side S in the longitudinal direction A or the transverse direction C. In the embodiment, a part of the multiple trenches 201b are perpendicular to the flat side S and the other part of the multiple trenches 201b are parallel to the flat side S. In another embodiment, the multiple trenches 201b can be formed in obliquely interlaced.

The predetermined scribing region 211R can be used as a buffer region for preventing the semiconductor stack 201, especially the active layer 2012, from being damaged during a breaking process. As shown in FIG. 6B, a shortest width W of the predetermined scribing region 211R can be between 1 μm and 60 μm. In one embodiment, the shortest width W of the predetermined scribing region 211R can be between 10 μm and 30 μm. In another embodiment, the trench 201b can expose a portion of the wafer substrate 200, wherein a shortest width of a top portion of the trench 201b can be between 24 μm and 30 μm, and a shortest width of the bottom surface 211s of the trench 201b can be between 18 μm and 20 μm.

Figure 6D:
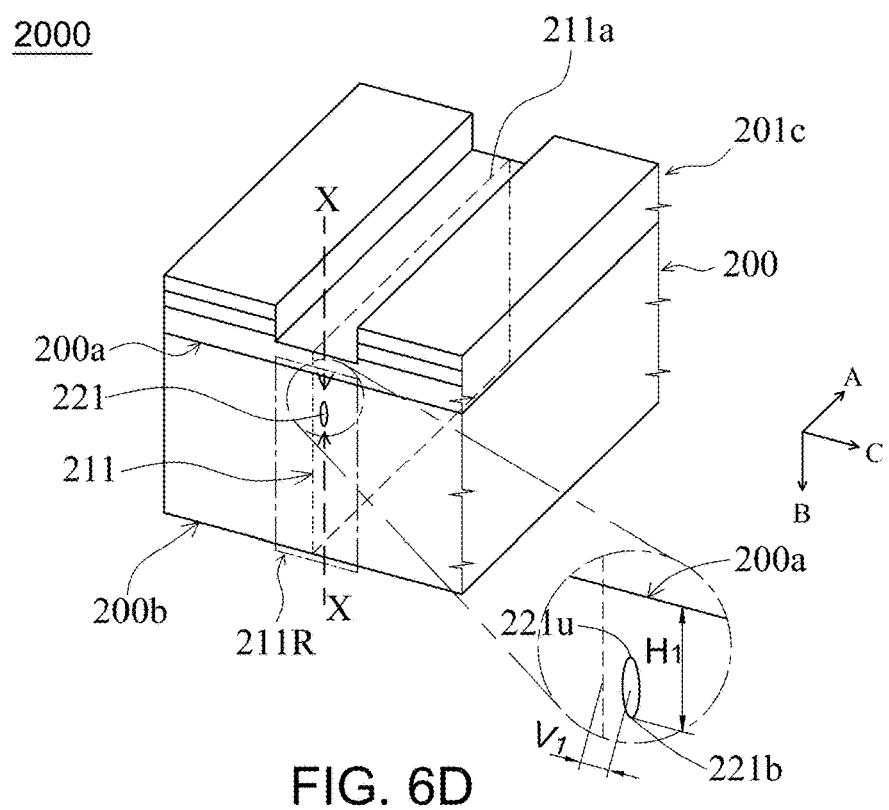
FIG. 6D shows a process of applying a first laser process in accordance with one embodiment of the present disclosure.

A step of applying a first laser process is applied after the mesa process, as shown in FIG. 6D. In the present embodiment, a laser beam X irradiates for penetrating the top surface 200a or the bottom surface 200b and into the predetermined scribing region 211R. Then, the laser beam X focuses at a first position in the wafer substrate 200 and then the laser beam X affects and changes the characteristic of the first position of the wafer substrate 200, such as mechanical strength or transparency, to form a first deteriorated region 221 at the first position. In the embodiment, the first position is near a first side of the predetermined scribing surface 211 and in the predetermined scribing region 211R. A first depth $H_1$ is defined from the top surface 200a to a bottom edge 221b of the first deteriorated region 221 and perpendicular to the top surface 200a. A first distance $V_1$ is defined from the predetermined scribing surface 211 to a center of the first deteriorated region 221. In the embodiment, the first depth $H_1$ can be about 30~50 μm, and the first distance $V_1$ can be about 1~5 μm. In another embodiment, the laser beam X can irradiate from the bottom surface 200b, and the first depth can be defined from the bottom surface 200b to an upper edge 221u of the first deteriorated region 221.

Figure 6E:
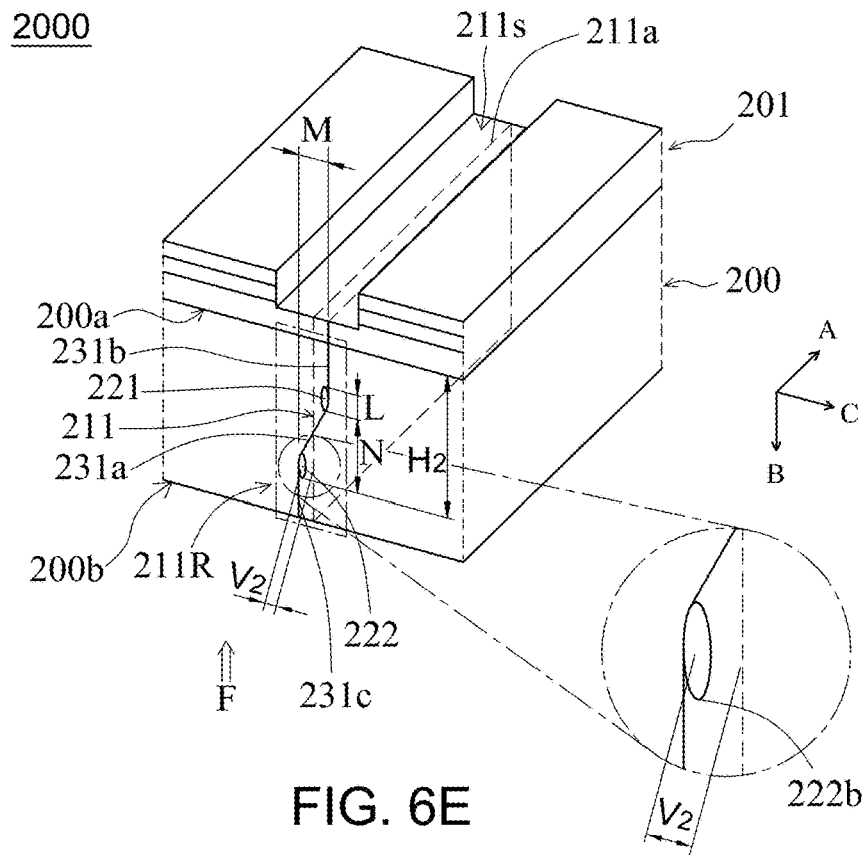
FIG. 6E shows a process of applying a second laser process in accordance with one embodiment of the present disclosure.
Figure 6F:
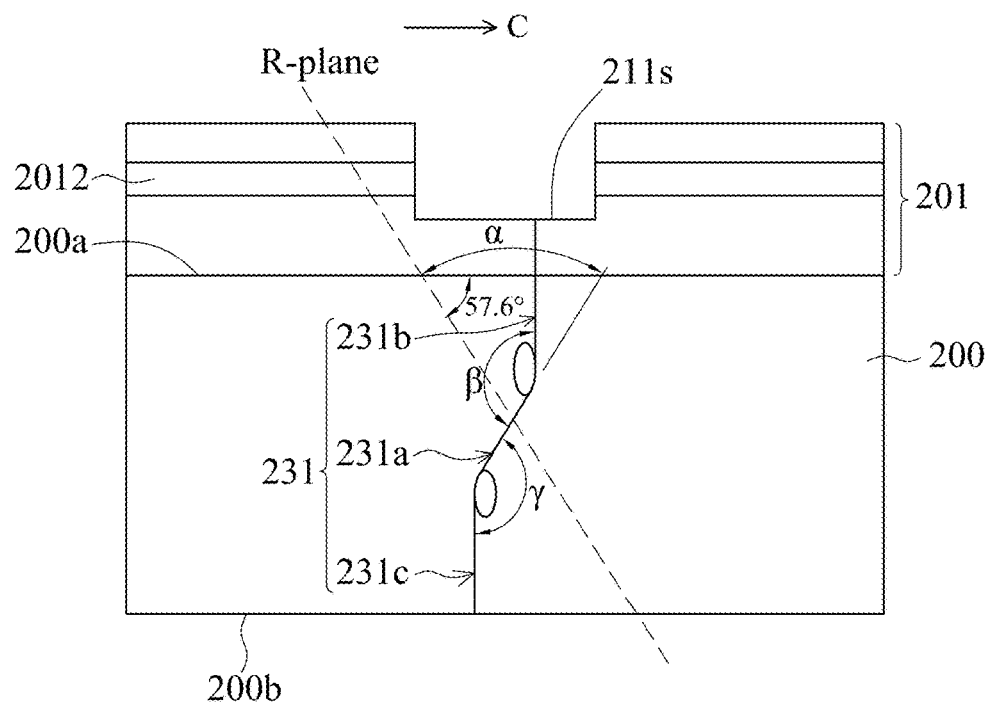
FIG. 6F shows a cross-sectional view of the substrate in accordance with one embodiment of the present disclosure.
Figure 6G:
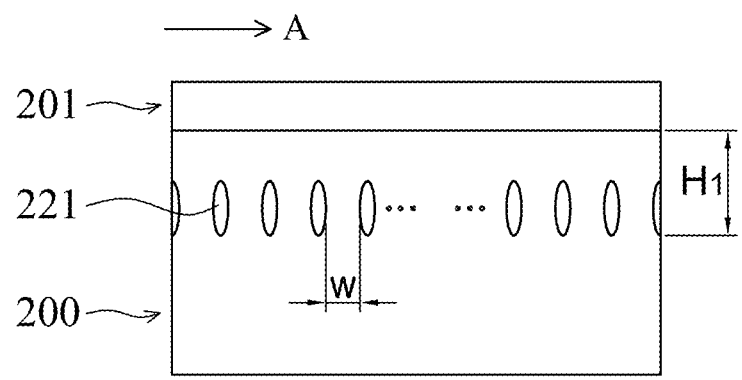
FIG. 6G shows a cross-sectional view of a plurality of the first deteriorated regions in the wafer substrate in accordance with one embodiment of the present disclosure.

FIG. 6G shows a cross-sectional view of a plurality of the first deteriorated regions 221 in the wafer substrate 200 along the longitudinal direction A. After forming one first deteriorated region 221 at the first position, the laser focus is shifted from the first position to a following position in the predetermined scribing region 211R along the extended direction of the trench 201b, for example the longitudinal direction A, at the first depth H1 and with the first distance V1, and then the first laser process is repeated to form another first deteriorated region 221. A plurality of first deteriorated regions 221 are formed thereafter and located on a first vertical plane as shown in FIG. 6G. In the embodiment, the laser focus can be shifted along the longitudinal direction A by shifting the laser beam or the wafer 2000.

Figure 6H:
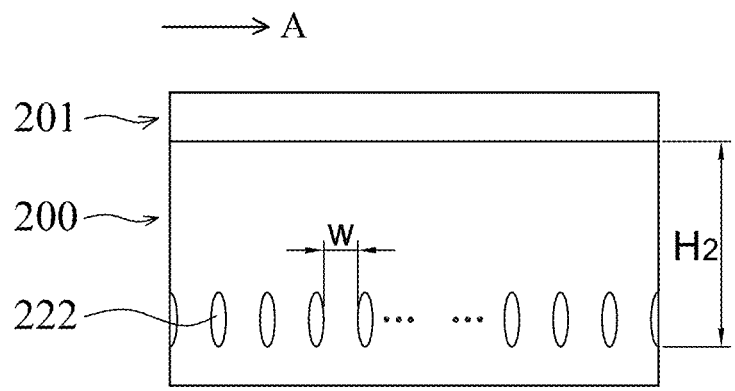
FIG. 6H shows a cross-sectional view of a plurality of the second deteriorated region on a second vertical plane in accordance with one embodiment of the present disclosure.

FIG. 6E illustrates a following step of applying a second laser process to form one or more second deteriorated regions 222. As shown in FIG. 6E, after the step of applying the first laser process, the laser beam X can be shifted to and focus on a second position near a second side of the predetermined scribing surface 211 in the predetermined scribing region 211R of the wafer substrate 200, wherein the second side is opposite to the first side of the predetermined scribing surface 211. The laser beam X can irradiate from the top surface 200a side or from the bottom surface 200b. A second deteriorated region 222 is formed at the second position by the laser beam treatment. A second depth H2 is defined from the top surface 200a to a bottom edge 222b of the second deteriorated region 222. A second distance V2 is defined from the predetermined scribing surface 211 to a center of the second deteriorated region 222. In the embodiment, the second depth H2 is larger than the first depth H1, and the second distance V2 is substantially the same as the first distance $V_1$. In the embodiment, the second depth $H_2$ can be between about 50~70 μm, and the second distance V2 can be about 1~5 μm. And, a shortest distance between the bottom edge 222b of the second deteriorated region 222 and the bottom surface 200b is larger than 40 μm. Then the laser focus is shifted from the second position to a following position in the predetermined scribing region 211R along the extended direction of the trench 201b, for example the longitudinal direction A, at the second depth $H_2$ and the second distance $V_2$, and then the second laser process is repeated to form another second deteriorated region 222 on a second vertical plane from a cross-sectional view as shown in FIG. 6H. In one embodiment, the first laser process and the second laser process can be applied in the wafer substrate 200 alternately. Thus, the first deteriorated regions 221 and the second deteriorated regions 222 can be formed alternately. In another embodiment, the first laser process and the second laser process can be applied in the wafer substrate 200 at the same time, such that one or more of the first deteriorated regions 221 and one or more of the second deteriorated regions 222 can be formed in the wafer substrate 200 at the same time, and the process time of forming the first deteriorated regions 221 and the second deteriorated regions 222 can be reduced.

Referring to FIG. 6E, a shortest distance M is defined along the direction C and from the center of the first deteriorated region 221 to a vertical line crossing the center of the second deteriorated region 222, and a shortest distance N is defined along a thickness direction B and from the bottom edge of the first deteriorated region 221 to a horizontal line crossing the bottom edge of the second deteriorated region 222. In the embodiment, the shortest distance M is about between 5~15 μm, and the shortest distance N is about between 10~100 μm or about between 30~50 μm. In addition, in one embodiment, the shortest distance M is not larger than ⅓ of a thickness of the wafer substrate 200 or a shortest distance between the top surface 200a and the bottom surface 200b. A length L of each first deteriorated region 221 or the second deteriorated region 222 is defined as a length along the thickness direction B and between the top and bottom of the deteriorated region as shown in FIG. 6E, and the length L can be about between 1~30 μm, and preferably can be about between 5~15 μm. The length L of the deteriorated region is adjustable according to the pulse duration and the output power of the laser beam during the laser process. In the embodiment, the first deteriorated regions 221 and the second deteriorated regions 222 are respectively on the first vertical plane and the second vertical plane, wherein the first vertical plane and the second vertical plane are different vertical planes. The first deteriorated regions 221 and the second deteriorated regions 222 are respectively facing the two opposite sides of the predetermined scribing surface 211.

Then, as shown in FIG. 6E, a breaking force F is provided to divide the wafer 2000 into multiple light emitting devices in a breaking process. In one embodiment, the breaking force F is provided on the predetermined scribing region 211R from the bottom surface 200b and in alignment with the predetermined scribing line 211a. In another embodiment, the breaking force F is provided on the predetermined scribing region 211R from the top surface 200a or the bottom surface 211s of the trench 201b.

When applying the breaking force F from the bottom surface 200b, the wafer substrate 200 is breaking and multiple cracks 231 are formed thereafter. In the embodiment, from a cross-sectional view as shown in FIG. 6F, the crack 231 can be formed in the predetermined scribing region 211R of the wafer substrate 200. The first deteriorated region 221 and the second deteriorated region 222 can be used to guide the crack 231 to pass through the first deteriorated region 221 and the second deteriorated region 222. The crack 231 has a first sub-crack 231a connecting the first deteriorated region 221 and the second deteriorated region 222, a second sub-crack 231b connecting the first deteriorated region 221 and the bottom surface 211s of the trench 201b, and a third sub-crack 231c connecting the second deteriorated region 222 and the bottom surface 200b. In the embodiment, the R-plane of the wafer substrate 200 and the connection between the first deteriorated region 221 and the second deteriorated region 222 form an angle α, wherein preferably 45°≤α≤135°, and the first sub-crack 231a is formed along the connection between the first deteriorated region 221 and the second deteriorated region 222 and has a cross with the predetermined scribing surface 211. In other words, the angle α is formed between the first sub-crack 231a and the R-plane of the wafer substrate 200. The second sub-crack 231b and the third sub-crack 231c are formed and respectively essentially perpendicular to the top surface 200a and the bottom surface 200b, such that the second sub-crack 231b and the first sub-crack 231a form an angle β, wherein 120°≤β≤170°, and the third sub-crack 231c and the first sub-crack 231a form an angle γ, wherein 120°≤γ≤170°. In contrast according to another embodiment, if the angle α is smaller than 45°, when applying the breaking force F on the wafer substrate 200, the crack 231 can be formed along the R-plane of the wafer substrate 200 to damage the semiconductor stack 201, especially the active layer 2012.

Figure 6I:
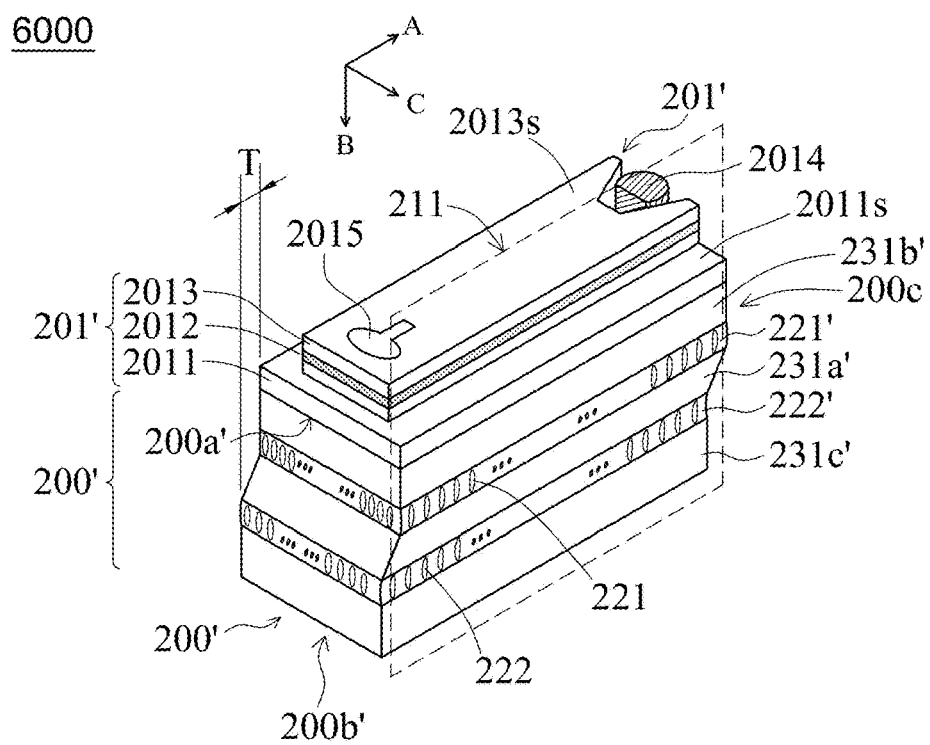
FIG. 6I illustrates the light emitting device in accordance with the fifth embodiment of the present disclosure in accordance with one embodiment of the present disclosure.
Figure 6J:
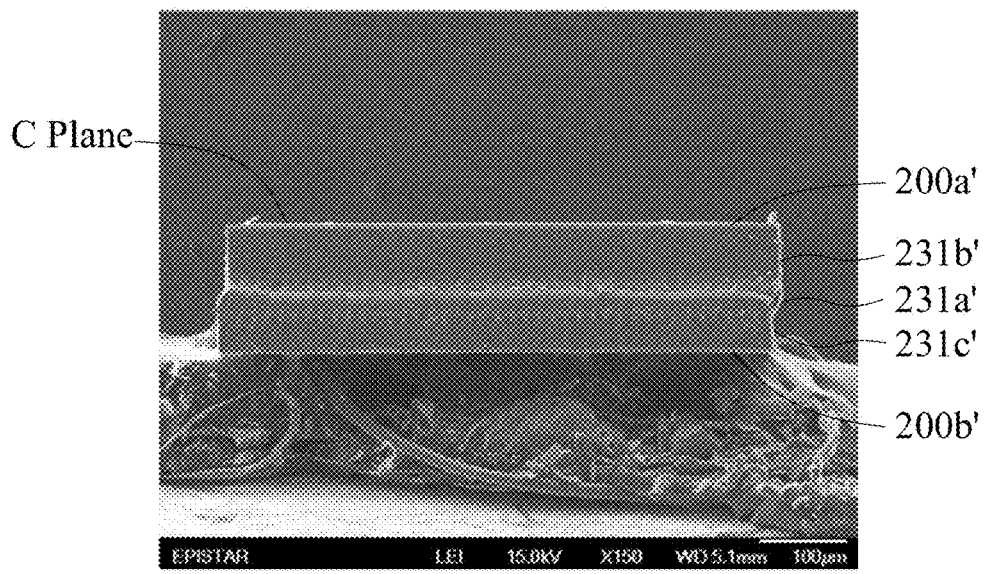
FIG. 6J shows a real photo of the light emitting device in accordance with the fifth embodiment of the present disclosure in accordance with one embodiment of the present disclosure.

As shown in FIGS. 6I to 6J, the light emitting device 6000 is formed after the breaking process. Referring to FIG. 6I, the light emitting device 6000 includes a first substrate 200' and a semiconductor stack 201 formed on the first substrate 200'; wherein the first substrate 200' includes a top surface 200a', a bottom surface 200b' and a first side surface 200c connecting the top surface 200a' and the bottom surface 200b', and the semiconductor stack 601 is formed on the top surface 200a'. The first side surface 200c includes a first deteriorated surface 221', a second deteriorated surface 222', and a first crack surface 231a' connecting the first deteriorated surface 221' and the second deteriorated surface 222', wherein the first deteriorated surface 221' includes the plurality of first deteriorated regions 221 and the second deteriorated surface 222' includes the plurality of second deteriorated regions 222. The first side surface 200c further includes a second crack surface 231b' connecting the first deteriorated surface 221' and the top surface 200a', and a third crack surface 231c' connecting the second deteriorated surface 222' and the bottom surface 200b' respectively. In the embodiment, the first crack surface 231a', the second crack surface 231b' and the third crack surface 231c' can be flat. The first deteriorated surface 221' and the second deteriorated surface 222' are rougher than the first crack surface 231a', the second crack surface 231b' and the third crack surface 231c'. In the embodiment, the first substrate 200' can include sapphire or any material having the crystal structure like sapphire, and the first crack surface 231a' and the R-plane of the first substrate 200' have the angle α, wherein 45°≤α≤135°. From the top view of the light emitting device 6000, the first crack surface 231a' is revealed from the semiconductor stack 601, and a shortest distance T between a board of the semiconductor stack 601 and a board of the first substrate 200' can be between about 1 μm and 30 μm. FIG. 6J shows a real photo of the light emitting device 6000 from the view along the axis A of FIG. 6I. The second crack surface 231b' and the third crack surface 231c' are respectively essentially perpendicular to the top surface 200a' and the bottom surface 200b', and the first crack surface 231a' is not parallel to the second crack surface 231b' and the third crack surface 231c'. Based on the crystal structure of sapphire as shown in FIG. 7, in the embodiment, the top surface 200a' is C-plane and the first crack surface 231a' is not perpendicular to the R-plane. Referring to FIG. 6B, the first electrode 2014 is formed on the first semiconductor layer 2011 and the second electrode 2015 is formed on the second semiconductor layer 2013 for conducting an electrical current into the semiconductor stack 601 and then emitting a light from the active layer 2012 of the semiconductor stack 601. The light emitting device 6000 can include at least two or more side surfaces having the same structure as the side surface 200c. From a top view, the shape of the light emitting device 6000 is not limited to rectangle and includes square, diamond, triangular or hexagonal.

Due to advantages of the light emitting device in accordance with the foregoing embodiments of the present disclosure, the light emitting device can be further incorporated within an optoelectronic system such as illumination apparatus, display, projector, or indicator.

Figure 10:
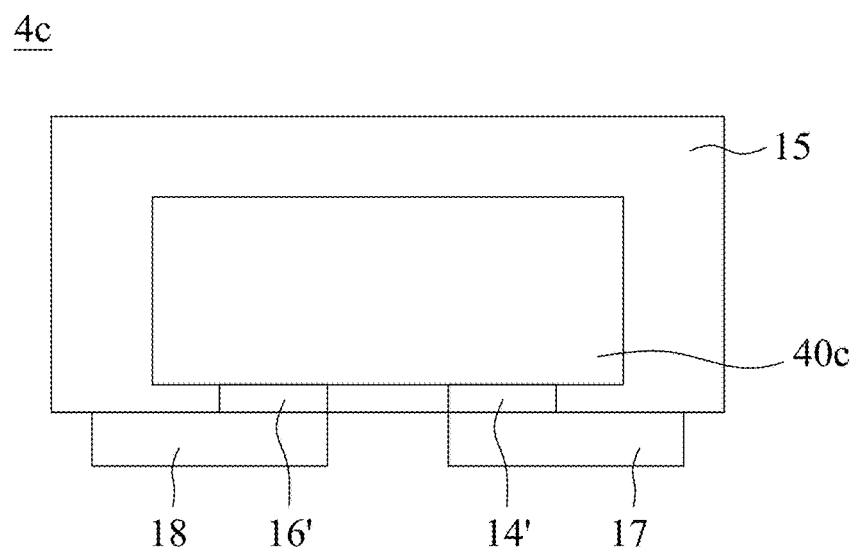
FIG. 10 illustrates a light-emitting unit in accordance with one embodiment of the present disclosure.

FIG. 10 illustrates a light-emitting unit 4c. The light-emitting unit 4c includes a light-emitting device 40c in accordance with the foregoing embodiments of the present disclosure, two electrical connecting ends 16', 14' on the light-emitting device 40c, a wavelength conversion layer 15 covering the light-emitting device 40c and exposing the two electrical connecting ends 16', 14', and two bonding pads 17, 18 formed on and respectively connecting the electrical connecting ends 16', 14'.

Figure 8:
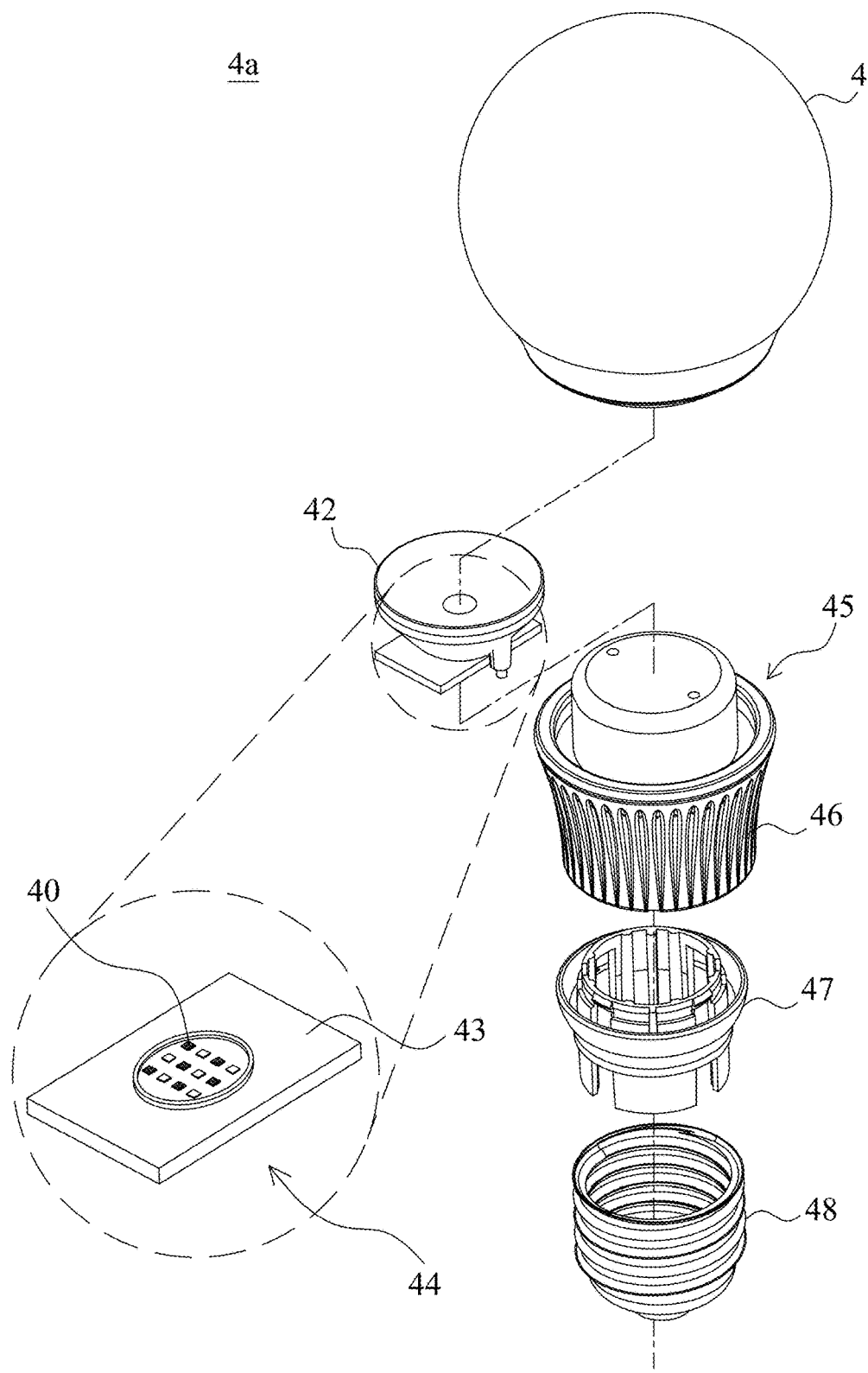
FIG. 8 illustrates an optoelectronic system in accordance with one embodiment of the present disclosure.

As shown in FIG. 8, an optoelectronic system 4a includes a cover 41, an optical element 42 in the cover 41, a light-emitting module 44 coupled with the optical element 42, a base 45 having a heat sink 46 for carrying the light-emitting module 44, a connection portion 47, and an electrical connector 48, wherein the connection portion 47 connects to the base 45 and the electrical connector 48. In an embodiment, the connection portion 47 can be integrated with the base 45 which means the connection portion 47 can be a part of the base 45. The light-emitting module 44 has a carrier 43 and a plurality of light-emitting devices 40 or the light-emitting unit 4c in accordance with the foregoing embodiments of the present disclosure on the carrier 43. The optical element may have a feature including refractor, reflector, diffuser, light guide or any combinations thereof, to direct light emitted from the light-emitting devices out of the cover 41 and perform lighting effects according to requirements for different applications of the optoelectronic system 4a.

Figure 9:
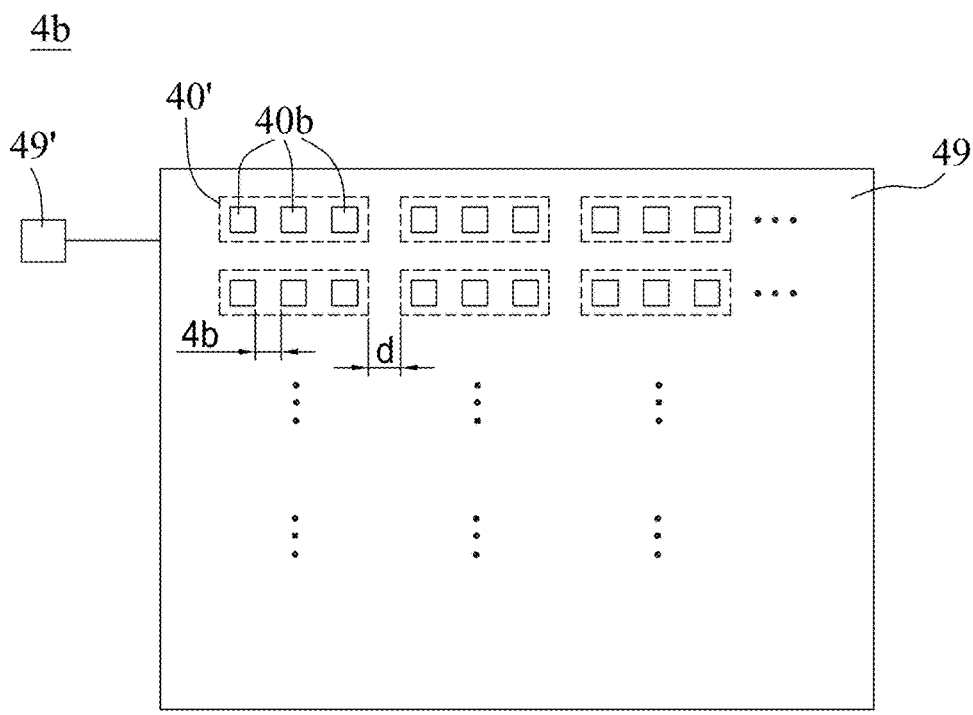
FIG. 9 illustrates another optoelectronic system in accordance with one embodiment of the present disclosure.

FIG. 9 illustrates another optoelectronic system 4b. The optoelectronic system 4b includes a board 49, multiple pixels 40' on and electrically connecting the board 49, a control module 49' electrically connecting the board 49 to control the multiple pixels 40', wherein one of the multiple pixels 40' includes one or more light-emitting devices 40b or the light-emitting unit 4c in accordance with the foregoing embodiments of the present disclosure, and the light-emitting devices 40b can be controlled by the control module 49' respectively. For example, the light-emitting devices 40b in one pixel 40' may include a first light-emitting device for emitting red light, a second light-emitting device for emitting blue light and/or a third light-emitting device for emitting green light. The light-emitting devices 40b can be disposed as a matrix with columns and rows, or be dispersed regularly or irregularly on the board 49. In an embodiment, preferably, a distance d between any two adjacent pixels 40' is between about 100 μm and 5 mm, and a distance d' between any two adjacent light-emitting devices 40b in one pixel 40' is between about 100 μm and 500 μm.

It will be apparent to those having ordinary skill in the art that the foregoing embodiments alone or combinations thereof shall be a part of the present disclosure, and various modifications and variations can be made in accordance with the present disclosure without departing from the scope or spirit of the disclosure. In view of the foregoing, it is intended that the present disclosure cover combinations, modifications and variations of this disclosure provided they fall within the scope of the following claims and their equivalents.

What is claimed is:

1. A compound semiconductor device, comprising:
   a substrate, comprising a top surface, a bottom surface, a side surface connecting the top surface and the bottom surface; and
   a semiconductor stack formed on the top surface,
   wherein the side surface comprises a first deteriorated surface, a second deteriorated surface, a first crack surface between the first and second deteriorated surfaces, a second crack surface between the first deteriorated surface and the top surface, and a third crack surface between the second deteriorated surface and the bottom surface,
   wherein the first crack surface is inclined to the first deteriorated surface or the second deteriorated surface, and
   wherein the second crack surface or the third crack surface is substantially perpendicular to the top surface or the bottom surface.

2. The compound semiconductor device as claimed in claim 1, wherein the first and the second deteriorated surfaces are rougher than at least one of the first crack surface, the second crack surface and the third crack surface.

3. The compound semiconductor device as claimed in claim 1, wherein the first crack surface and an R-plane of the substrate form an angle α, and 45°≤α≤135°.

4. The compound semiconductor device as claimed in claim 3, wherein a material of the substrate comprises sapphire.

5. The compound semiconductor device as claimed in claim 1, wherein the second crack surface is substantially parallel to the third crack surface.

6. The compound semiconductor device as claimed in claim 1, wherein one of a convex region and a concave region is formed by the first deteriorated surface, the first crack surface and the second crack surface, and another one of the convex region and the concave region is formed by the second deteriorated surface, the first crack surface and the third crack surface.

7. The compound semiconductor device as claimed in claim 1, wherein the first deteriorated surface comprises a plurality of first deteriorated regions, and the second deteriorated surface comprises a plurality of second deteriorated regions.

8. The compound semiconductor device as claimed in claim 7, wherein one of the plurality of first deteriorated regions or one of the plurality of the second deteriorated regions has a length defined along a direction from the top surface to the bottom surface, and the length is between 1 μm and 30 μm.

9. The compound semiconductor device as claimed in claim 7, wherein a shortest length between one of the first deteriorated regions and one of the second deteriorated regions is between 1 μm and 30 μm.

10. The compound semiconductor device as claimed in claim 1, wherein the second crack surface and the first crack surface form an angle β, and 120°≤β≤170°.

11. The compound semiconductor device as claimed in claim 1, wherein the third crack surface and the first crack surface form an angle γ, and 120°≤γ≤170°.

12. The compound semiconductor device as claimed in claim 1, wherein a distance perpendicular to the top surface and between the first deteriorated surface and the top surface is larger than 40 μm.

13. The compound semiconductor device as claimed in claim 1, wherein a distance perpendicular to the bottom surface and between the second deteriorated surface and the bottom surface is larger than 40 μm.

14. The compound semiconductor device as claimed in claim 1, wherein the semiconductor stack comprises a lower semiconductor layer, an upper semiconductor layer, and an active layer between the lower semiconductor layer and the upper semiconductor layer, and the lower semiconductor layer have an exposed lower surface.

15. The compound semiconductor device as claimed in claim 14, wherein the upper semiconductor layer comprises an upper surface opposite to the active layer.

16. The compound semiconductor device as claimed in claim 15, further comprising a first electrode on the upper surface, and a second electrode on the exposed lower surface.

17. The compound semiconductor device as claimed in claim 1, wherein, from the top view of the compound semiconductor device, the first crack surface protrudes beyond the semiconductor stack.

18. The compound semiconductor device as claimed in claim 17, wherein the first crack surface protrudes beyond the semiconductor stack with a distance, and the distance is between 1 μm and 30 μm.

* * * * *